(12) United States Patent
Luo et al.

(10) Patent No.: US 12,237,846 B2
(45) Date of Patent: *Feb. 25, 2025

(54) SYSTEMS FOR ERROR REDUCTION OF ENCODED DATA USING NEURAL NETWORKS

(71) Applicant: MICRON TECHNOLOGY, INC., Boise, ID (US)

(72) Inventors: Fa-Long Luo, San Jose, CA (US); Jaime Cummins, Bainbridge Island, WA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/158,332

(22) Filed: Jan. 23, 2023

(65) Prior Publication Data

US 2023/0163788 A1 May 25, 2023

Related U.S. Application Data

(63) Continuation of application No. 17/302,228, filed on Apr. 27, 2021, now Pat. No. 11,563,449.

(51) Int. Cl.
*H03M 13/37* (2006.01)
*G06F 7/544* (2006.01)
*G06N 3/08* (2023.01)

(52) U.S. Cl.
CPC .......... *H03M 13/37* (2013.01); *G06F 7/5443* (2013.01); *G06N 3/08* (2013.01)

(58) Field of Classification Search
CPC ......... H03M 13/37; G06F 7/5443; G06N 3/08
See application file for complete search history.

(56) References Cited

U.S. PATENT DOCUMENTS

| 7,321,882 B2 | 1/2008 | Jaeger |
| 9,988,090 B2 | 6/2018 | Nishikawa |

(Continued)

FOREIGN PATENT DOCUMENTS

| CN | 106203624 A | 12/2016 |
| CN | 108353046 A | 7/2018 |

(Continued)

OTHER PUBLICATIONS

U.S. Appl. No. 16/839,447, titled "Neural Networks and Systems for Decoding Encoded Data", dated Apr. 3, 2020, pp. all pages of application as filed.

(Continued)

*Primary Examiner* — Thien Nguyen
(74) *Attorney, Agent, or Firm* — Dorsey & Whitney LLP

(57) ABSTRACT

Examples described herein utilize multi-layer neural networks, such as multi-layer recurrent neural networks to estimate an error-reduced version of encoded data based on a retrieved version of encoded data (e.g., data encoded using one or more encoding techniques) from a memory. The neural networks and/or recurrent neural networks may have nonlinear mapping and distributed processing capabilities which may be advantageous in many systems employing a neural network or recurrent neural network to estimate an error-reduced version of encoded data for an error correction coding (ECC) decoder, e.g., to facilitate decoding of the error-reduced version of encoded data at the decoder. In this manner, neural networks or recurrent neural networks described herein may be used to improve or facilitate aspects of decoding at ECC decoders, e.g., by reducing errors present in encoded data due to storage or transmission.

20 Claims, 13 Drawing Sheets

(56) References Cited

U.S. PATENT DOCUMENTS

| | | | |
|---|---|---|---|
| 10,176,802 B1 | 1/2019 | Ladhak et al. | |
| 10,400,928 B2 | 9/2019 | Baldwin et al. | |
| 10,491,243 B2 | 11/2019 | Kumar et al. | |
| 10,552,738 B2 | 2/2020 | Holt et al. | |
| 10,698,657 B2 | 6/2020 | Kang et al. | |
| 10,749,594 B1 | 8/2020 | O'shea et al. | |
| 10,812,449 B1 | 10/2020 | Cholleton | |
| 10,924,152 B1 | 2/2021 | Luo | |
| 11,088,712 B2 | 8/2021 | Zamir et al. | |
| 11,196,992 B2 | 12/2021 | Huang et al. | |
| 11,416,735 B2 | 8/2022 | Luo et al. | |
| 11,424,764 B2 | 8/2022 | Luo | |
| 11,563,449 B2 * | 1/2023 | Luo | H03M 13/37 |
| 11,599,773 B2 | 3/2023 | Luo et al. | |
| 11,755,408 B2 | 9/2023 | Luo et al. | |
| 11,973,513 B2 | 4/2024 | Luo et al. | |
| 12,095,479 B2 | 9/2024 | Luo | |
| 2004/0015459 A1 | 1/2004 | Jaeger | |
| 2005/0228845 A1 | 10/2005 | Pius et al. | |
| 2006/0013289 A1 | 1/2006 | Hwang | |
| 2006/0200258 A1 | 9/2006 | Hoffberg et al. | |
| 2009/0106626 A1 | 4/2009 | Hou et al. | |
| 2009/0292537 A1 | 11/2009 | Ehara et al. | |
| 2011/0029756 A1 | 2/2011 | Biscondi et al. | |
| 2017/0177993 A1 | 6/2017 | Draelos et al. | |
| 2017/0310508 A1 | 10/2017 | Moorti et al. | |
| 2017/0370508 A1 | 12/2017 | Baldwin et al. | |
| 2018/0022388 A1 | 1/2018 | Nishikawa | |
| 2018/0046897 A1 | 2/2018 | Kang et al. | |
| 2018/0174050 A1 | 6/2018 | Holt et al. | |
| 2018/0249158 A1 | 8/2018 | Huang et al. | |
| 2018/0307494 A1* | 10/2018 | Ould-Ahmed-Vall | G06N 20/00 |
| 2018/0322388 A1 | 11/2018 | O'Shea | |
| 2018/0336469 A1* | 11/2018 | O'Connor | G06N 3/049 |
| 2018/0343017 A1 | 11/2018 | Kumar et al. | |
| 2018/0357530 A1 | 12/2018 | Beery et al. | |
| 2019/0196952 A1* | 6/2019 | Manchiraju | G06F 11/3676 |
| 2019/0197549 A1 | 6/2019 | Sharma | |
| 2020/0012953 A1 | 1/2020 | Sun et al. | |
| 2020/0014408 A1 | 1/2020 | Kim | |
| 2020/0065653 A1 | 2/2020 | Meier et al. | |
| 2020/0160838 A1 | 5/2020 | Lee | |
| 2020/0210816 A1 | 7/2020 | Luo et al. | |
| 2020/0234103 A1 | 7/2020 | Luo et al. | |
| 2020/0296741 A1 | 9/2020 | Ayala Romero et al. | |
| 2020/0356620 A1 | 11/2020 | Yen et al. | |
| 2020/0402591 A1 | 12/2020 | Xiong et al. | |
| 2021/0004208 A1 | 1/2021 | Lai et al. | |
| 2021/0143840 A1 | 5/2021 | Luo | |
| 2021/0273707 A1 | 9/2021 | Yoo et al. | |
| 2021/0287074 A1 | 9/2021 | Coenen | |
| 2021/0304009 A1 | 9/2021 | Bazarsky et al. | |
| 2021/0319286 A1 | 10/2021 | Gunduz | |
| 2021/0336779 A1 | 10/2021 | Jho et al. | |
| 2021/0351863 A1 | 11/2021 | Gunduz | |
| 2022/0019900 A1 | 1/2022 | Wong et al. | |
| 2022/0368349 A1 | 11/2022 | Luo et al. | |
| 2022/0368356 A1 | 11/2022 | Luo et al. | |
| 2022/0399904 A1 | 12/2022 | Luo | |
| 2023/0115877 A1 | 4/2023 | Luo et al. | |
| 2023/0208449 A1 | 6/2023 | Luo et al. | |

FOREIGN PATENT DOCUMENTS

| | | |
|---|---|---|
| KR | 20170128080 A | 11/2017 |
| KR | 20180054554 A | 5/2018 |
| KR | 20180084988 A | 7/2018 |
| KR | 20200062322 A | 6/2020 |
| KR | 20200124504 A | 11/2020 |
| WO | 2020131868 A1 | 6/2020 |
| WO | 2020139976 A1 | 7/2020 |
| WO | 2021096641 A1 | 5/2021 |
| WO | 2022232065 A1 | 11/2022 |
| WO | 2022232066 A1 | 11/2022 |

OTHER PUBLICATIONS

U.S. Appl. No. 16/683,217, titled "Recurrent Neural Networks and Systems for Decoding Encoded Data", filed Nov. 13, 2019, pp. all pages of application as filed.

Huo et al. "A Tutorial and Review on Inter-Layer FEC Coded Layered Video Streaming" in IEEE Communications Survey & Tutorials, vol. 17, No. 2, 2nd Quarter 2015; pp. 1166-1207.

International Search Report & Written Opinion dated Aug. 10, 2022 for PCT Application No. PCT/US2022/026217, pp. all.

U.S. Appl. No. 17/821,391, titled, "Recurrent Neural Networks and Systems for Decoding Encoded Data," filed Aug. 22, 2022, pp. all pages of application as filed.

U.S. Appl. No. 17/496,703 titled "Systems for Estimating Bit Error Rate (BER) of Encoded Data Using Neural Networks" filed Oct. 7, 2021, pp. all pages of application as filed.

U.S. Appl. No. 17/302,226, titled "Decoders and Systems for Decoding Encoded Data Using Neural Networks", filed Apr. 27, 2021, pp. all pages of application as filed.

U.S. Appl. No. 17/302,228, titled "Systems for Error Reduction of Encoded Data Using Neural Networks", filed Apr. 27, 2021, pp. all pages of application as filed.

U.S. Appl. No. 16/233,576 titled "Neural Networks and Systems for Decoding Encoded Data" filed Dec. 27, 2018, pp. all pages of application as filed.

Cao, Congzhe et al."DEEP Learning-Based Decoding of Constrained Sequence Codes", Retrieved from URL: https:/arxiv.org/pdf/1906.06172, Jun. 2019, 13 pages.

Huang, Kunping et al., "Functional Error Correction for Robust Neural Networks", Retrieved from URL: https://arxiv.org/pdf/2001.03814, Jan. 2020, 24 pages.

Kim, Minhoe et al., "Building Encoder and Decoder With Deep Neural Networks: On the Way to Reality", Retrieved from <https://arxiv.org/abs/1808.02401>, dated Aug. 7, 2018, p. 4-5.

Lipton, Zachary C. et al., "A Critical Review of Recurrent Neural Networks for Sequence Learning", Retrieved from https://arxiv.org/abs/1506.00019v4, Oct. 17, 2015, pp. all.

Sun, Yang et al., "VLSI Architecture for Layered Decoding of QC-LDPC Codes With High Circulant Weight" IEEE Transactions on Very Large Scale Integration (VLSI) Systems, vol. 21, No. 10, pp. 1960-1964, Oct. 2013.

I. Wodiany and A. Pop "Low-Precision Neural Network Decoding of Polar Codes", 2019 IEEE 20th International Workshop on Signal Processing Advances in Wireless Communications (SPAWC), Cannes, FR; Jul. 2019 pp. all.

U.S. Appl. No. 18/179,317, filed Mar. 6, 2023 and titled, "Neural Networks and Systems for Decoding Encoded Data,"; pp. all pages of application as filed.

Navneet Agrawal "Machine Intelligence in Decoding of Forward Error Correction Codes"; Degree Project in Information and Communication Technology; KTH Royal Institute of Technology, School of Electrical Engineering; Sweeden Oct. 2017; pp. all.

Chang, Andre , et al., "Hardware Accelerators for Recurrent Neural Networks on FPGA", IEEE International Symposium on Circuits and Systems (ISCAS), 4 pgs, May 2017.

Kim, Minhoe , et al., "Toward the Realization of Encoder and Decoder Using Deep Neural Networks", IEEE Communications Magazine, vol. 57, No. 5, 7 pages, May 2019.

Nachmani, Eliya , et al., "RNN Decoding of Linear Block Codes", arxiv.org, Cornell University Library, 7 pgs, Feb. 2017.

Payani, Ali , et al., "Decoding LDPC Codes On Binary Erasure Channels Using Deep Recurrent Neural-Logic Layers", IEEE 10th International Symposium on Turbo Codes & Iterative Information Processing, 5 pgs, Dec. 2018.

Sandoval Ruiz, Cecilia , "FPGA Prototyping of Neuro-Adaptive Decoder", Advances in Computational Intelligence, Man-Machine Systems and Cybernetics, 6 pgs, Dec. 2010.

(56) References Cited

OTHER PUBLICATIONS

Soltani, Rohollah, et al., "Higher Order Recurrent Neural Networks", Retrieved May 31, 2023 from: https://arxiv.org/pdf/1605.00064.pdf, 9 pgs.

Teng, Chieh-Fang, et al., "Low-Complexity Recurrent Neural Network-Based Polar Decorder With Weight Quantization Mechanism", arxiv.org, Cornell University Library, 5 pgs, Oct. 2018.

Agrawal, Navneet, "Machine Intelligence in Decoding of Forward Error Correction Codes", KTH Royal Institute of Technology, School of Electrical Engineering, Degree Project in Information and Communication Technology, Second Cycle; Oct. 2, 2017; pp. all.

Chang, Andre Xian Ming, et al., "Hardware Accelerators for Recurrent Neural Networks On FPGA", IEEE International Symposium on Circuits and Systems, May 2017, 4 pages.

Kim, Minhoe, et al., "Toward the Realization of Encoder and Decoder Using Deep Neural Networks", IEEE Communications Magazine, May 2019, 7 pages.

Soltani, Rohollah, et al., "Higher Order Recurrent Neural Networks", Journal arXiv:1605.00064, Apr. 2016, 9 pages.

\* cited by examiner

SYSTEMS FOR ERROR REDUCTION OF ENCODED DATA USING NEURAL NETWORKS

CROSS REFERENCE TO RELATED APPLICATION(S)

This application is a continuation of U.S. patent application Ser. No. 17/302,228 filed Apr. 27, 2021 and issued as U.S. Pat. No. 11,563,449 on Jan. 24, 2023. The aforementioned application, and issued patent, is incorporated herein by reference, in its entirety, for any purpose.

TECHNICAL FIELD

Examples described herein relate to neural networks, including recurrent neural networks, for use in reducing error (e.g., noise) in encoded data. Examples of neural networks are described which may be used with error-correcting coding (ECC), where a neural network may be used to facilitate error reduction of encoded data by estimating an error-reduced version of the encoded data.

BACKGROUND

Error correction coding (ECC) may be used in a variety of applications, such as memory devices or wireless baseband circuitry. Generally, error correction coding techniques may encode original data with additional bits to describe the original bits which are intended to be stored, retrieved, and/or transmitted. The additional bits may be stored together with the original bits. Accordingly, there may be L bits of original data to be stored and/or transmitted. An encoder may provide N-L additional bits, such that the encoded data may be N bits worth of data. The original bits may be stored as the original bits, or may be changed by the encoder to form the encoded N bits of stored data. A decoder may decode the N bits to retrieve and/or estimate the original L bits, which may be corrected in some examples in accordance with the ECC technique.

Additionally, memory devices may operate with complex error correction techniques whose area and power needs are rising; resulting in higher cost silicon and longer firmware development times. For example, some aspects of decoding encoded data may impose additional area and power needs on a memory device.

Bit flips (e.g., a change in charge at a memory cell) may occur in non-volatile memory devices. Bit flips of encoded data (e.g., bits of encoded data stored in degraded memory cells) introduce noise to the encoded data, thereby introducing errors in the encoded data.

DETAILED DESCRIPTION

Figure 1A:
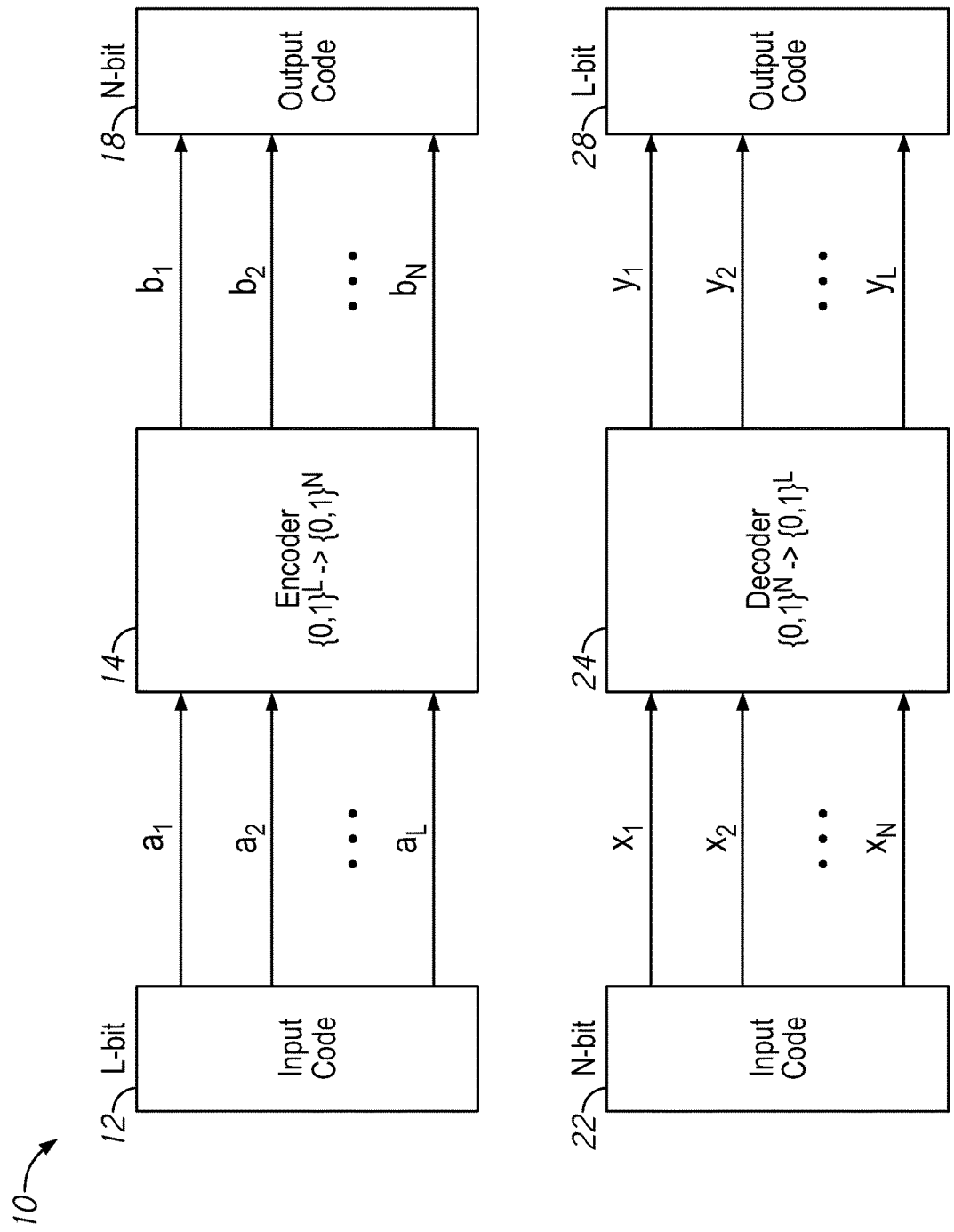
FIG. 1A is a schematic illustration of an ECC system arranged in accordance with examples described herein.

Multi-layer neural networks and/or multi-layer recurrent neural networks may be used to decode encoded data (e.g., data encoded using one or more encoding techniques). Such neural networks may have nonlinear mapping and distributed processing capabilities which may be advantageous in many systems employing the neural network decoders. In the examples described herein, neural networks (NNs) (e.g., such as recurrent neural networks (RNNs)) may be trained to transform noisy encoded data to an error-reduced version of the encoded data. The error-reduced version of encoded data may be an estimate of the encoded data provided at an output of an encoder. The encoder may utilize an encoding technique, and the used NN may be associated with that encoding technique. For example, an error-reduced version of the encoded data may have a reduced bit error rate (BER) or an increased signal-to-noise ratio (SNR) as compared to a respective BER or SNR of encoded data retrieved from memory. The encoded data retrieved from memory may include errors (e.g., error introduced by bit flips that occurred during the reading process).

Advantageously, an error-reduced version of the encoded data may be decoded by a decoder with reduced errors. For example, an error reduction NN may reduce and/or improve errors which may be introduced by noise present in the encoded data. Noise may be introduced when storing the encoded data in memory that is degraded (e.g., due to bit flips) and/or when reading the data out of the memory. As an example, in some non-volatile memory devices, bit flips may degrade memory storage capabilities. Accordingly, an error reduction NN may facilitate decoding of encoded data, e.g., by reducing noise present in the encoded data, thereby reducing errors in the decoded data after decoding of an error-reduced version of the encoded data.

There are a variety of particular error correction coding techniques which may be used in accordance with examples described herein, including low density parity check coding (LDPC), Reed-Solomon coding, Bose-Chaudhuri-Hocquenghem (BCH), and polar coding. The use of these coding techniques, however, may come at the cost of the decrease of the frequency and/or channel and/or storage resource usage efficiency and the increase of the processing complexity. For example, the use of coding techniques may increase the amount of data which may be stored and/or communicated (e.g., within a memory system). Frequently storing and/or transmitting encoded data may increase errors present in the encoded data. Errors present in encoded data may be referred to as error bits because one or more bits may be changed in a version of encoded data when at least a portion of a stored version of encoded data experiences noise. For example, a stored version of encoded data may include error bits when provided to a decoder, because the stored version of encoded data may be subjugated to noise distortions during storage (e.g., bit flips) or may experience noise during communication (e.g., to/from memory for storage, or to a decoder). Accordingly, there may be a need to reduce errors (e.g., error bits) in versions of encoded data, to facilitate decoding of the encoded data.

An error-reduced version of encoded data may be decoded with less errors present in the decoded data, as compared to decoding a stored version of encoded data that may include error bits. Advantageously, decoding of error-reduced versions of encoded data may improve processing speed (e.g., time to decode encoded data) or reduce computational/power resources used for decoding. Thus, examples of the systems and methods described herein may be utilized in many emerging applications such as Internet of Things (IoT) and/or tactile internet where ultra-low power consumption and ultra-low latency are highly desirable. Accordingly, there is a need to provide an error reduction NN that may reduce semiconductor area and/or power needs in electronic devices using encoders and/or decoders.

FIG. 1A is a schematic illustration of an ECC system arranged in accordance with examples described herein. In the ECC system 10, an encoder 14 may receive L bits of input data (a1, a2, . . . aL) 12. Any number of bits may be used as L As part of ECC system 10, the encoder 14 may encode the input data in accordance with an encoding technique to provide N bits of encoded data as output code (b1, b2, . . . bN) 18. Any number of bits may be used as N—generally N may be greater than L. For example, as depicted in FIG. 1A, an encoder 14 may receive an L set of input data bits {0,1} and may encode the L bits into an N set of encoded data {0,1}. In some implementations, the encoded data may be stored and/or transmitted, or some other action taken with the encoded data, which may introduce noise into the data. For example, during transmission or communication of encoded data in an electronic device implementation of ECC system 10, the encoded data, which is communicated as a signal in the FCC system 10, may experience noise due to voltage or current disturbances in the electronic device.

Continuing with reference to the FCC system 10 of FIG. 1A, a decoder 24 may receive a version of the N bits of encoded data (x1, x2, . . . xN) as input code data 22. The N bits of encoded data (x1, x2, . . . xN) may correspond to the N bits of encoded data (b1, b2, . . . bN) output by the encoder, but with errors being introduced. The errors may be introduced by storage and/or retrieval from memory and/or transmission to the decoder. For example, during transmission from a memory to a decoder in ECC system 10, the encoded data may experience noise on a bus coupling the memory to the decoder, e.g., due to voltage or current disturbances on the bus. The decoder 24 may decode the input code data 22 into an estimate of the L bits original data (a1, a2, . . . aL) as output data 28 (y1, y2, . . . yL). For example, as depicted in FIG. 1A, a decoder 24 may receive an N set of input encoded data bits {0,1} to decode the N bits as an L set of decoded data {0,1}.

Examples of memory devices or wireless baseband circuitry may utilize error correction coding (such as low density parity check coding, LDPC). An encoder 14 may add particularly selected N-L bits into an original data of L bits, which may allow a decoder 24 to decode the data and reduce and/or minimize errors introduced by noise, interferences and/or other practical factors in the data storage and transmission.

Examples described herein utilize neural networks (NNs), such as multi-layer neural networks and/or multi-layer recurrent neural networks (RNNs) to reduce any error present or introduced in the N bits of encoded data (x1, x2, . . . xN) such that the NNs provide an estimate of an error-reduced version of the encoded data. The error-reduced version of encoded data, output by an error reduction NN, is an estimate of the N bits of encoded data (b1, b2, . . . bN) output by the encoder 14. For example, the error-reduced version of the encoded data, provided as an estimate of (e.g., equivalent to) encoded data (b1, b2, . . . bN) by a NN, may include a reduction of a bit error rate (BER) or an increase of a signal-to-noise ratio (SNR) as compared to a respective BER or SNR of encoded data retrieved from memory. The NN utilized to perform the error reduction of encoded data including error (e.g., including at least one error bit) may be trained to transform retrieved encoded data to an estimate of an error-reduced version of encoded data. Accordingly, in example implementations described herein, error reduction NNs, including error reduction RNNs, may estimate of an error-reduced version of encoded data, to facilitate providing the encoded data to a decoder for decoding.

Figure 1B:
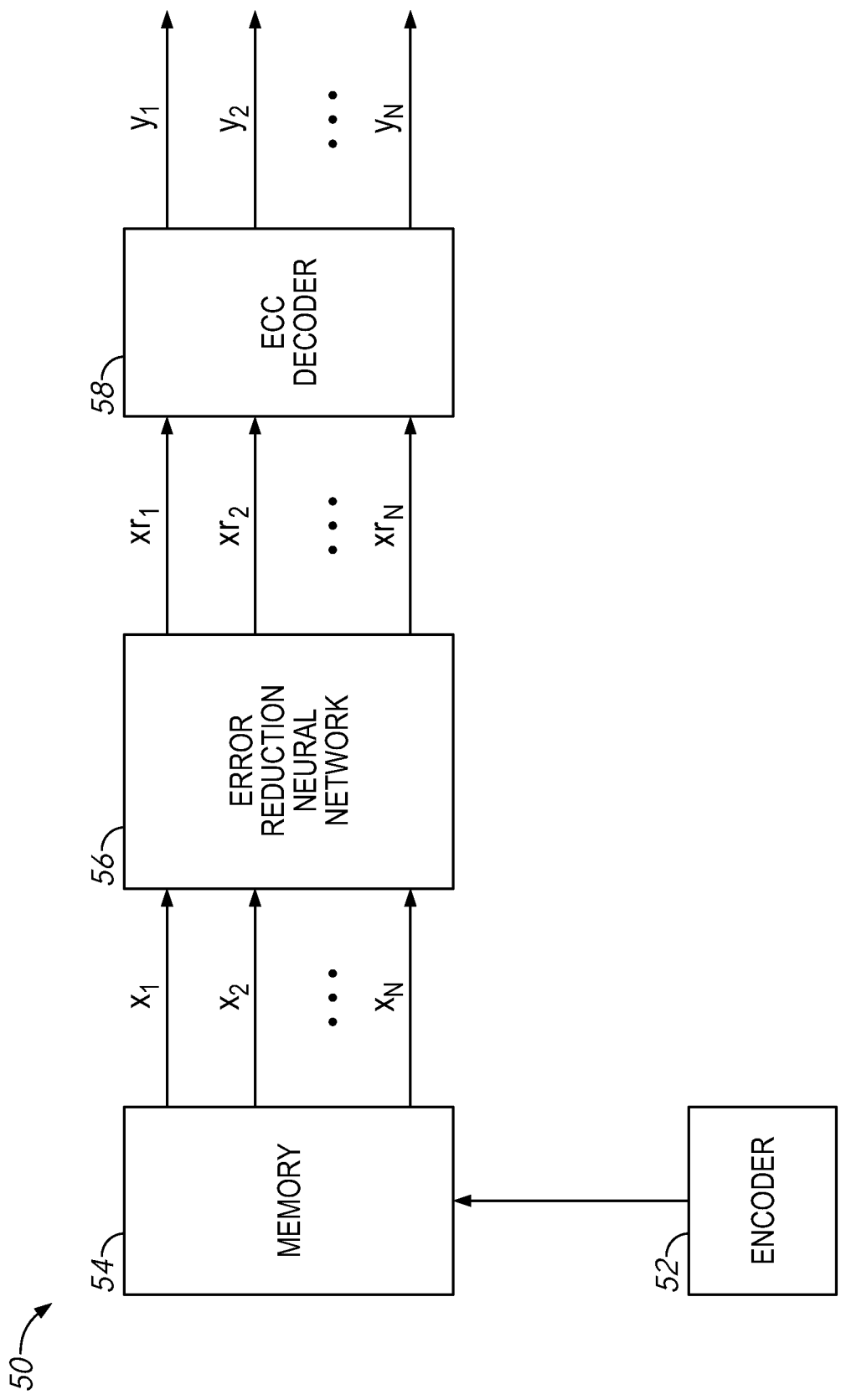
FIG. 1B is a schematic illustration of an example of a memory system arranged in accordance with examples described herein.

FIG. 1B is a schematic illustration of an example of a memory system 50 arranged in accordance with examples described herein. The memory system 50 includes encoder 52 coupled to a memory 54 (e.g., a memory device). The encoder 52 may provide encoded data to the memory 54 for storage and/or may transmit, via the memory 54, the encoded data to the error reduction neural network (NN) 56. For example, the encoder 52 may implement the encoder 14 to output N bits of encoded data (b1, b2, . . . bN). The encoded data may be any encoded data that is encoded in accordance with an encoding technique, e.g., any error correction coding techniques, including LDPC coding, Reed-Solomon coding, BCH coding, or polar coding. Accordingly, the encoder 52 may be an ECC encoder for any type of ECC coding.

The memory 54 may provide the N bits of encoded data (x1, x2, . . . xN) to the error reduction NN 56. In the example, the N bits of encoded data (x1, x2, . . . xN), output by the memory 54, are representative of the N bits of encoded data (b1, b2, . . . bN) output by the encoder 52, but with errors being introduced. For example, during transmission from the memory 54 to the error reduction NN 56, the encoded data may experience noise on the bus coupling the memory 54 to the encoder 52, e.g., due to voltage or current disturbances on the bus. As another example, the encoded data may experience noise on the memory buses coupling the memory 54 to the error reduction NN 56, e.g., due to voltage or current disturbances on those memory buses.

Additionally or alternatively, storing N bits of encoded data (b1, b2, . . . . bN) in memory 54 may introduce environmental or other noise. Accordingly, noise may be introduced in storing the encoded data in memory 54 that is degraded (e.g., due to bit flips). Accordingly, encoded data retrieved from the memory 54 may be referred to as a stored version of encoded data, which may include errors present in that stored version of encoded data. For example, the errors may be error bits due to certain bits of the encoded data being flipped when stored in the memory 54. Thus, error being present in the encoded data whether by transmission or storage or other reason, the error reduction NN 56 receives N bits of encoded data as the encoded data (x1, x2, . . . xN).

The memory system 50 may further include the error reduction NN 56 that estimates an error-reduced version of encoded data (xr1, xr2, . . . xrN) based on the received version of encoded data (x1, x2, . . . xN). This received version of encoded data, retrieved from the memory 54, may be referred to as a stored version of encoded data. In the example, the error reduction NN 56 receives the N bits of encoded data (x1, x2, . . . , xN). Accordingly, the error reduction NN 56 may receive encoded data which includes error present, e.g., by storing in and/or transmitting via memory 54 the N bits of encoded data (b1, b2, . . . bN). The error reduction NN 56 be implemented using any type of neural network, including examples of recurrent neural networks described herein. Generally, neural networks described herein may be implemented using one or more processor(s) and memory encoded with instructions which, when executed by the processor(s), implement the neural network. The neural network may be trained, e.g., weights and/or connections for the neural network may be determined. The weights and/or connections determined during training may be stored (e.g., in a same or different memory used to store instructions for implementing the neural network).

In the example, based on the stored version of encoded data received and weights acquired during a training process of the error reduction NN 56, the error reduction NN 56 may estimate the error-reduced version of the encoded data (xr1, xr2, . . . xrN). Thus, the error reduction NN 56 may generate an estimate of the N bits of encoded data b1, b2, . . . bN). For example, the estimate of the error-reduced version of the encoded data (xr1, xr2, . . . xrN) may be equivalent to output from the encoder 52 and/or may be closer to the output from the encoder 52 than the retrieved noisy data. In this manner, a neural network may be used to implement error reduction NN 56 which has been trained to receive encoded data and output an error-reduced version of the encoded data. In some examples, the neural network may be trained on data using a particular encoding technique (e.g., the neural network may be particular to an encoding technique). Advantageously, the output of the error reduction NN 56—the N bits (xr1, xr2, . . . xrN) may include a reduction of a bit error rate (BER) or an increase of a signal-to-noise ratio (SNR) as compared to a respective BER or SNR of the N bits of encoded data (x1, x2, . . . xN) retrieved from memory 54. Accordingly, the error reduction NN 56 may reduce and/or improve errors which may be introduced by noise present in the encoded data.

The error reduction NN 56 may be trained to determine parameters e.g., weights) for use by error reduction NN 56 to perform a particular mapping between input encoded data and output an error-reduced version of encoded data. For example, training the neural error reduction NN 56 may provide one set of parameters (e.g., weights) to use when reducing error present in encoded data (e.g., due to storage or transmission thereof) that had been encoded with a particular encoding technique (e.g., low density parity check coding (LDPC), Reed-Solomon coding, Bose-Chaudhuri-Hocquenghem (BCH), and/or Polar coding). In various examples, the training of the error reduction NN 56 may vary according to or particular to different encoding techniques, such that different sets of parameters are trained for each encoding technique. For example, the error reduction NN 56 may be trained multiple times, using different known errored-encoded data and known encoded data pairs, for example. multiple trainings may result in multiple sets of connection weights. For example, a different set of weights may be determined for each of multiple encoding techniques—e.g., one set of weights may be determined for use with decoding LDPC encoded data and another set of weights may be determined for use with decoding BCH encoded data. Accordingly, in various implementations, the various sets of weights may correspond to weights used to estimate an error-reduced version of encoded data based on a received version of encoded data, to facilitate providing decoded data, e.g., with reduced errors present. In the example, the known-errored encoded data may be data that was retrieved in a similar manner as to how data may be provided to an error reduction NN (e.g., error reduction NN 56). For example, the known-errored encoded data may be data that was retrieved from the memory 54 having known memory defects (e.g., N bits of encoded data (x1, x2, . . . xN)). Using the known-errored encoded data, an error reduction NN may be trained on data, such that the error reduction NN 56 may also use the same memory 54 having memory defects, but with reduced error, once trained.

The memory system 50 may further include the FCC decoder 58, which may be capable of decoding data for any type of encoding technique that is utilized by the encoder 52. The FCC decoder 58 may receive the error-reduced version of encoded data—the N bits (xr1, xr2, . . . xrN) from the error reduction NN 56. The FCC decoder 58 may decode the error-reduced version of encoded data in accordance with a corresponding decoding process of an FCC encoding technique. Based on the error-reduced version of encoded data, the FCC decoder 58 may provide decoded data in accordance with a decoding technique implemented by the FCC decoder 58. In some examples, the decoder 58 may include an iterative decoder, such as message probability computing (MPC) circuitry. In the example, the ECC decoder 58 may implement one or more message passing techniques to perform decoding. Advantageously, an error-reduced version of encoded data (e.g., N bits (xr1, xr2, . . . xrN)) may be decoded with less errors present in the decoded data, as compared to the N bits of encoded data (x1, x2, . . . xN) retrieved from memory 54, which may include error hits due to noise introduced during storage or communication of the encoded data. Additionally and advantageously, decoding of error-reduced versions of encoded data by the FCC decoder 58 may improve processing speed (e.g., time to decode encoded data) or reduce computational/power resources used for decoding. Accordingly, the memory system 50 may be utilized in many emerging applications such as Internet of Things (IoT) and/or tactile internee where ultra-low power consumption and ultra-low latency are highly desirable.

While described in the specific context of FIG. 1B, generally described, a memory system 50 may include any number of circuitries or components to implement aspects of the memory system 50, which generally operates to decode an error-reduced version of encoded data.

Figure 1C:
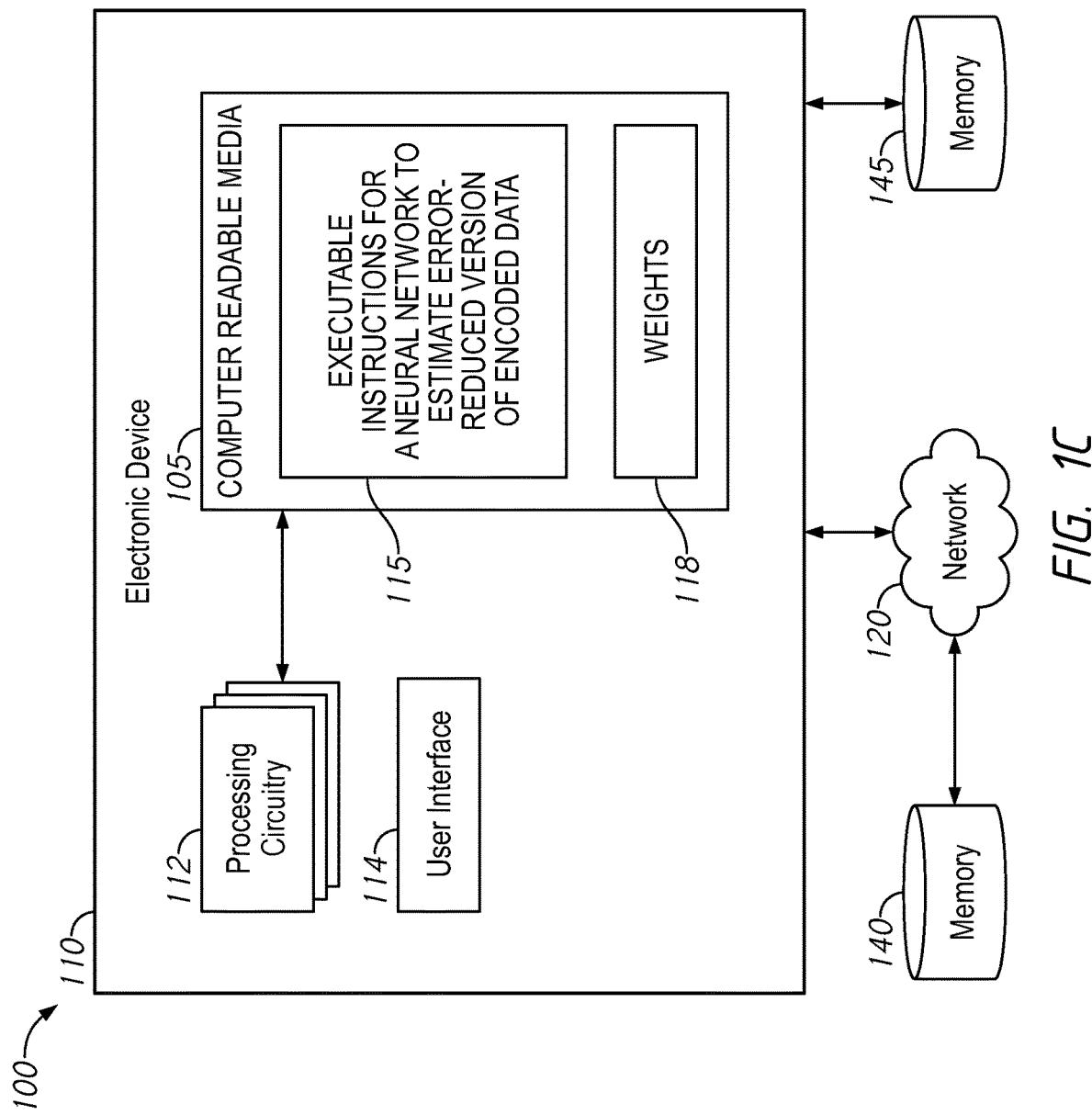
FIG. 1C is a schematic illustration of a computing system arranged in accordance with examples described herein.

FIG. 1C is a schematic illustration of an electronic device 110 arranged in a system 100 in accordance with examples described herein. The electronic device 110 may be coupled to a memory 140 via network 120 and/or may be coupled to and/or include memory 145, each of which may store coefficient data. For example, the coefficient data may be weights for a neural network or a recurrent neural network. Coefficient data stored in the memory 140 or memory 145 may include coefficient data which may be mixed with encoded data received by the electronic device 110 in examples described herein. The encoded data may also be stored in the memory 140 or 145. The electronic device 110 may obtain the encoded data (e.g., N encoded input bits) from the memory 140 or memory 145 to decode the data to be output as decoded output data.

Electronic device 110 also includes processing circuitry 112 that may interact with computer readable media 105, which may be encoded with instructions executable by the processing circuitry 112, e.g., the executable instructions 115. In some implementations, computer readable media 105 may be implemented as a memory, which may include both storage media and communication media. Example computer readable media 105 may include volatile and nonvolatile, removable and non-removable media implemented in any method or technology for storage of information, such as computer readable instructions. The computer readable media 105 includes, stored therein, the executable instructions 115 for a neural network to estimate an error-reduced version of encoded data (e.g., (xr1, xr2, . . . xrN) output from error reduction NN 56) based on the received version of encoded data (x1, x2, . . . xN). For example, the executable instructions 115 may include instructions to select certain coefficient data (e.g., from memory 140 or memory 145) and to store the coefficient data as weights in weights memory 118 of the computer readable media 105. The executable instructions 115 may further include instructions to provide those weights 118 to one or more of the multiplication/accumulation units and/or memory look-up units of FIGS. 2A-2C whose details will be presented after describing FIGS. 1C-1E. As used herein, the weights 118 may be referred to as a plurality of coefficients or pluralities of coefficients (e.g., coefficient data). In some examples, the weights 118 stored in the computer readable media 105 may be used by a neural network implemented using the processing circuitry 112 (e.g., error reduction NN 56) to facilitate decoding encoded data that is associated with a particular encoding technique, e.g., by reducing error present in the encoded data due to storage or transmission thereof. The executable instructions 115 may include instructions to select certain coefficient data as weights 118 based on an indicated encoding technique. For example, header information or another flag associated with encoded data (e.g., obtained from memory 140 or 145) may indicate weights associated with (e.g., trained according to) a particular encoding technique. In the example, the executable instructions 115 may be executed to store certain weights 118 from the memory 140 or memory 145. Additionally, the executable instructions 115 may be executed to facilitate decoding of encoded data into decoded data when the weights 118 are used by processing circuitry 112 implementing a neural network to estimate an error-reduced version of encoded data based on a version of encoded data received at an error reduction NN (e.g., a stored version of encoded data retrieved from a memory).

The processing circuitry 112 may be used to implement an error reduction NN error reduction NN 56). The processing circuitry 112 may be implemented using one or more processors, for example, having any number of cores. In some examples, the processing circuitry 112 may include custom circuitry (e.g., one or more field programmable gate arrays, and/or application-specific integrated circuits), and/or firmware for performing functions described herein. The processing circuitry 112 can include multiplication unit/accumulation units for performing the described functions, as described herein, e.g., for a neural network to estimate an error-reduced version of encoded data, e.g., based on a received version of encoded data. Processing circuitry 112 can be implemented in some examples using a microprocessor or a digital signal processor (DSP), or any combination thereof. In some examples, processing circuitry 112 can include levels of caching, such as a level one cache and a level two cache, a core, and registers. An example processor core can include an arithmetic logic unit (ALU), a bit manipulation unit, a multiplication unit, an accumulation unit, an adder unit, a look-up table unit, a memory look-up unit, or any combination thereof. Examples of processing circuitry 112 are described herein, for example with reference to FIG. 2A, 2B, or 2C.

The computer readable media 105 may be encoded with executable instructions 115 for a neural network to estimate an error-reduced version of encoded data at the processing circuitry 112. For example, in the context of decoding encoded data from memory 140 or 145, the executable instructions 115 for a neural network to estimate an error-reduced version of encoded data may include instructions for receiving the encoded data from the memory 140 or 145; and to transform that received encoded data at the processing circuitry 112 into an error-reduced version of encoded data, e.g., by estimating an error-reduced version of encoded data at an error reduction NN 56. For example, the executable instructions 115 may include instructions for receiving a stored version of encoded data, retrieved from the memory 140 via a network 120 or memory 145 (e.g., a stored version of encoded data). The stored version of encoded data may be representative of N bits of encoded data (e.g., x1, x2, . . . xN). The stored version of encoded data may include error(s), such as errors introduced, e.g., by storing in and/or transmitting via memory 140 or 145 the N bits of encoded data (b1, b2, . . . bN).

The executable instructions 115 for a neural network to estimate an error-reduced version of encoded data may further include instructions for multiplying a portion of the received version of encoded data with coefficient data (e.g., the weights 118) to generate a coefficient multiplication result and accumulating the coefficient multiplication result to be further multiplied and accumulated with another portion of the encoded data and coefficient data, examples of which are described herein. For example, to generate a coefficient multiplication result, a first layer of multiplication accumulation processing units (MAC units) may calculate the received version of encoded data with the plurality of coefficients to generate such coefficient multiplication results, or first processing results of the first layer of MAC units. Continuing in the example, to provide the output data, additional layers of MAC units may calculate the first processing results with additional pluralities of coefficients to generate additional coefficient multiplication results, or second processing results of the additional layers of MAC units. The MLUs of a last layer of the additional layers of MAC units may provide the estimate of the error-reduced version of encoded data based on the second processing results. Accordingly, the executable instructions 115 for a neural network to estimate an error-reduced version of encoded data may include various sets of executable instructions for different types of hardware implementations, such as those shown in FIGS. 2A-2C, to implement such computing of a received version of encoded data with coefficient data (e.g., the weights 118).

The user interface 114 may be implemented with any of a number of input devices including, but not limited to, a touchscreen, keyboard, mouse, microphone, or combinations thereof. The user interface 114 may receive input from a user, for example, regarding decoding certain encoded data at the processing circuitry 112. The user interface 114 may communicate the user input to the computer readable media 105. Example user interfaces 114 include a serial interface controller or a parallel interface controller, which may be configured to communicate with external input devices (e.g., keyboard, mouse, pen, voice input device, touch input device, etc.).

The network 120 may include a wired network or direct-wired connection, and wireless media such as acoustic, radio frequency (RF), microwave, infrared (IR) and other wireless media.

The memory(s) 140, and 145 (or computer readable media 105, if being implemented as a memory) may be implemented using any storage medium accessible to the processing circuitry 112. For example, RAM, ROM, solid state memory, flash memory, disk drives, system memory, optical storage, or combinations thereof, may be used to implement the computer readable media 105 or memory(s) 140, and 145. In storing encoded data in memories 140 or 145, environmental or other noise may be introduced in the storing process. For example, noise may be introduced in storing the encoded data in memory 140 or 145 that is degraded (e.g., due to bit flips). Accordingly, encoded data received from the memory(s) 140 or 145 may be referred to as noisy encoded data or encoded data including at least one error bit. In some implementations, the computer readable media 105 may store associations between coefficients and particular encoding techniques described herein, e.g., such that, the executable instructions 115 may utilize the associations to select certain coefficient data in memories 140 or 145 as the weights 118.

The electronic device 110 may be implemented using any of a variety of computing systems, including but not limited to one or more desktop, server, laptop, or other computers. The electronic device 110 generally includes processing circuitry 112. The computing system 100 may be implemented as a mobile communication device using any user communication device, including but not limited to, a desktop, laptop, cellular phone, tablet, appliance, automobile, or combinations thereof. The electronic device 110 may be programmed with an application e.g., may include processing circuitry 112 and computer readable media 105 encoded with instructions 115 which, when executed, cause the electronic device 110 to perform described functions) for a neural network to estimate an error-reduced version of encoded data. For example, the electronic device 110 may be programmed to receive an indication from a touchscreen of a mobile communication device that certain encoded data received in a 5G wireless transmission is to be decoded by first passing the received version of encoded data through an error reduction NN (e.g., error reduction NN 56) implemented at the processing circuitry 112. In the example, a 5G wireless transmission may introduce errors to transmitted encoded data due to noise or environmental disturbances to the 5G wireless transmission. Advantageously, an error reduction NN and/or RNN may facilitate decoding of encoded data received via a 5G wireless transmission, e.g., by reducing noise present in the encoded data, thereby reducing errors in the decoded data after decoding of an error-reduced version of the encoded data.

It is to be understood that the arrangement of computing systems of the system 100 may be quite flexible, and although not shown, it is to be understood that the system 100 may include many electronic devices 110, which may be connected via the network 120 can operate in conjunction with each other to perform the systems and methods described herein. The memory 145 and/or the memory 140 may in some examples be implemented using the same media, and in other examples may be implemented using different media. For example, while the memory 140 is shown in FIG. 1C as coupled to the network 120, it can be appreciated that the memory 140 may also be implemented electronic device 110 as part of the computer readable media 105. Additionally, while a single user interface 114 is shown in FIG. 1C, it can be appreciated that the electronic device 110 may further include any number of input devices, output devices, and/or peripheral components. For example, the user interface 114 may be the interface of a mobile communication device.

Figure 1D:
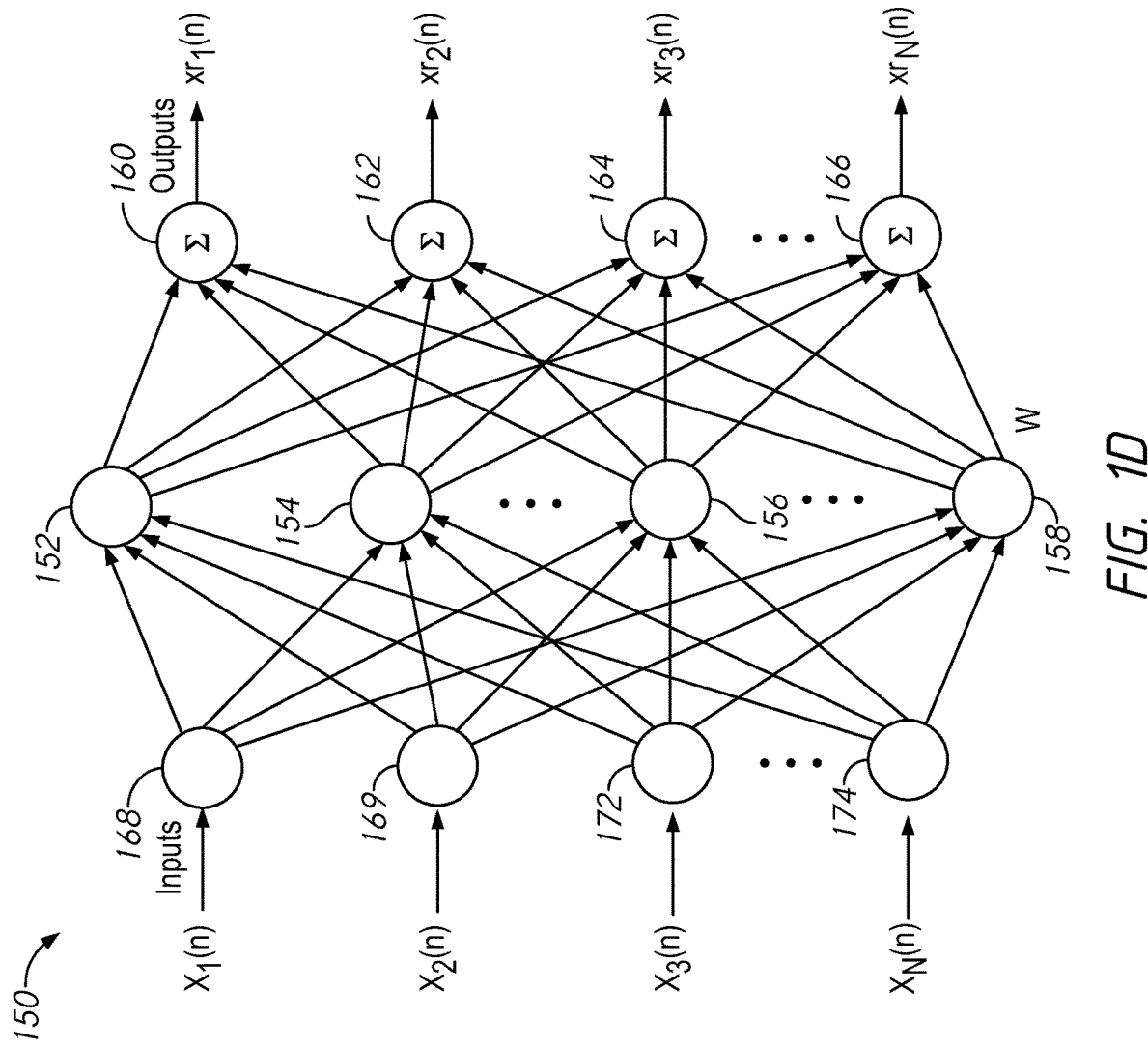
FIG. 1D is a schematic illustration of a neural network arranged in accordance with examples described herein.

FIG. 1D is a schematic illustration of a neural network arranged in accordance with examples described herein. The neural network 150 include three stages (e.g., layers). While three stages are shown in FIG. 1D, any number of stages may be used in other examples. A first stage of neural network 150 includes node 168, node 169, node 172, and node 174. A second stage of neural network 150 includes combiner 152, combiner 154, combiner 156, and combiner 158. A third stage of neural network 150 includes combiner 160, combiner 162, combiner 164, and combiner 166. Additional, fewer, and/or different components may be used in other examples.

Generally, a neural network may be used including multiple stages of nodes. The nodes may be implemented using processing circuitry 112 which may execute one or more functions on inputs received from a previous stage and provide the output of the functions to the next stage of the neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units described with respect to FIGS. 2A-2C. Details of example implementations of neural network 150, in the context of FIGS. 2A-2C, will be presented in the description of FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 150 may be implemented by the electronic device 110.

In the example, of FIG. 1D, the neural network 150 may have an input layer, which may be a first stage of the neural network including node 168, node 169, node 172, and node 174. The nodes node 168, node 169, node 172, and node 174 may implement a linear function which may provide the input signals (e.g., $x1(n)$, $x2(n)$, ... $xN(n)$) to another stage of the neural network (e.g., a 'hidden stage' or 'hidden layer'), Accordingly, in the example of FIG. 1D, N bits of encoded data (e.g., a received or stored version of encoded data) may be provided to an input stage (e.g., an input layer) of a neural network during operation. In some examples, the input data may be data encoded in accordance with an encoding technique (e.g., low density parity check coding (LDPC), Reed-Solomon coding, Bose-Chaudhuri-Hocquenghem (BCH), and/or Polar coding). The N bits of input data may be output by the first stage of the neural network 150 to a next stage of the neural network 150. In some examples, the connection between the first stage and the second stage of the neural network 150 may not be weighted—e.g., processing units in the second stage may receive unaltered bits from the first stage in some examples, Each of the input bit may be provided to multiple ones of the processing units in the next stage. While an input layer is shown, in some examples, the input layer may not be present.

The nodes node 168, node 169, node 172, and node 174 may be implemented, for example, using bit manipulation units that may forward the signals $x_1(n)$, $x_2(n)$, $x_3(n)$, $x_N(n)$ to combiner 152, combiner 154, combiner 156, and combiner 158, respectively. In some implementations, a bit manipulation unit may perform a digital logic operation on a bitwise basis. For example, a bit manipulation unit may be a NOT logic unit, an AND logic unit, an OR logic unit, a NOR logic unit, a NAND logic unit, or an XOR logic unit.

The neural network 150 may have a next layer, which may be referred to as a 'hidden layer' in some examples. The next layer may include combiner 152, combiner 154, combiner 156, and combiner 158, although any number of elements may be used. While the processing elements in the second stage of the neural network 150 are referred to as combiners, generally the processing elements in the second stage may perform a nonlinear activation function using the input data bits received at the processing element. Combiner 152, combiner 154, combiner 156, and combiner 158 may be implemented, for example, using multiplication units that include a nonlinear vector set (e.g., center vectors) based on a nonlinear activation function. Any number of nonlinear activation functions may be used. Examples of functions which may be used include Gaussian functions, such as $$f(r) = \exp\left(-\frac{r^2}{\sigma^2}\right).$$

Examples of functions which may be used include multi-quadratic functions, such as $f(r)=(r^2+\sigma^2)^{1/2}$. Examples of functions which may be used include inverse multi-quadratic functions, such as $f(r)=(r^2+(r^2)^{-1/2}$. Examples of functions which may be used include thin-plate-spline functions, such as $f(r)=r^2 \log(r)$. Examples of functions which may be used include piece-wise linear functions, such as $$f(r) = \frac{1}{2}(|r+1| - |r-1|).$$

Examples of functions which may be used include cubic approximation functions, such as $$f(r) = \frac{1}{2}(|r^3 + 1| - |r^3 - 1|).$$

In these example functions, σ represents a real parameter (e.g., a scaling parameter) and r is the distance between the input vector and the current vector. The distance may be measured using any of a variety of metrics, including the Euclidean norm.

Each element in the 'hidden layer' may receive as inputs selected bits (e.g., some or all) of the input data. For example, each element in the 'hidden layer' may receive as inputs from the output of multiple selected elements (e.g., some or all elements) in the input layer. For example, each element in the 'hidden layer' may receive as inputs from the output of multiple selected units (e.g., some or all units) in the input layer. For example, the combiner 152 may receive as inputs the output of node 168, node 169, node 172, and node 174. While a single 'hidden layer' is shown by way of example in FIG. 1D, any number of 'hidden layers' may be present and may be connected in series. While four elements are shown in the 'hidden layer', any number may be used, and they may be the same or different in number than the number of nodes in the input layer and/or the number of nodes in any other hidden layer. The nodes in the hidden layer may evaluate at least one non-linear function using combinations of the data received at the hidden layer node (e.g., element). In this manner, the hidden layer may provide intermediate data at an output of one or more hidden layers.

The neural network 150 may have an output layer. The output layer in the example of FIG. 1D may include combiner 160, combiner 162, combiner 164, and combiner 166, although any number of elements may be used. While the processing element in the output stage of the neural network 150 are referred to as combiners, generally the processing elements in the output may perform any combination or other operation using data bits received from a last 'hidden layer' in the neural network. Each element in the output layer may receive as inputs selected bits (e.g., some or all) of the data provided by a last 'hidden layer'. For example, the combiner 160 may receive as inputs from the outputs of combiner 152, combiner 154, combiner 156, and combiner 158. The connections between the hidden layer and the output layer may be weighted. For example, a set of weights W may be specified. There may be one weight for each connection between a hidden layer node and an output layer node in some examples. In some examples, there may be one weight for each hidden layer node that may be applied to the data provided by that node to each connected output node. Other distributions of weights may also be used. The weights may be multiplied with the output of the hidden layer before the output is provided to the Output layer. In this manner, the output layer may perform a sum of weighted inputs. Accordingly, an output of the neural network 150 (e.g., the outputs of the output layer) may be referred to as a weighted sum. The output layer may accordingly combine intermediate data received from one or more hidden layers using weights to provide output data.

In some examples, the neural network 150 may be used to provide N output bits which represent processed data corresponding to N input bits. For example, in the example of FIG. 1D, N input bits are shown ($x_1(n)$, $x_2(n)$, ... $x_N(n)$) and N output bits are provided (xr1, xr2, . . . xrN). As described herein, the N output bits may be an error-reduced version of encoded data. In an example implementation, the neural network 150 may estimate the error-reduced version of encoded data, e.g., the error-reduced version of the received encoded data that is equivalent to output from an encoder associated with the encoding technique (e.g., N bits of encoded data (b1, b2, . . . bN) output by the encoder 52). The neural network 150 may be trained such that the weights W used and/or the functions provided by the elements of the hidden layers cause the neural network 150 to provide output bits which represent the processed data corresponding to the N encoded input bits. The input bits may have been encoded with an encoding technique, and the weights and/or functions provided by the elements of the hidden layers may be determined based on the known "errored-encoded" data and the known data encoded in accordance with an encoding technique In the example, errored-encoded data may correspond to known encoded data but with at least one error bit introduced into the encoded data in at least one known portion of the encoded data. In an example, errored-encoded data may be representative of a received version of encoded data (x1, x2, . . . xN) that is retrieved from a memory (e.g., a memory 54), e.g., a stored version of encoded data.

Examples of neural networks may be trained. Training generally refers to the process of determining weights, functions, and/or other attributes to be utilized by a neural network to create a desired transformation of input data to output data. In some examples, neural networks described herein may be trained to transform noisy encoded data (e.g., a received version of encoded data including at least one error bit) to an error-reduced version of encoded data. In some examples, neural networks described herein may be trained to transform noisy encoded data to an error-reduced version of encoded data using an estimate of encoded data. For example, the error-reduced version of the encoded data, provided as an estimate of (e.g., equivalent to) encoded data (b1, b2, . . . bN) by a neural network 150, may include a reduction of a bit error rate (BER) or an increase of a signal-to-noise ratio (SNR) as compared to a respective BER or SNR of a received version of encoded data (x1, x2, . . . xN).

Training as described herein may be supervised or unsupervised in various examples. In some examples, training may occur using known pairs of anticipated input and desired output data. For example, training may utilize known encoded data and known errored-encoded data pairs to train a neural network to decode subsequent encoded data into an error-reduced version of encoded data. In some examples, training may utilize known encoded data and known errored-encoded data pairs to train a neural network to decode subsequent noisy encoded data into error-reduced version of encoded data. Examples of training may include determining weights to be used by a neural network, such as neural network 150 of FIG. 1D. In some examples, the same neural network hardware is used during training as will be used during operation. In some examples, however, different neural network hardware may be used during training, and the weights, functions, or other attributes determined during training may be stored for use by other neural network hardware during operation.

Examples of training can be described mathematically. For example, consider input data at a time instant (n), given as: $X(n)=[x_1(n), x_2(n), \ldots x_N(n)]^T$. The center vector for each element in hidden layer(s) of the neural network 150 (e.g., combiner 152, combiner 154, combiner 156, and combiner 158) may be denoted as $C_i$ (for i=1, 2, . . . , H, where H is the element number in the hidden layer).

The output of each element in a hidden layer may then be given as:

$$h_i(n)=f_1(\|X(n)-C_i\|) \text{ for } (i=1,2,\ldots,H) \quad (1)$$

The connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$mp_i(n)=\sum_{j=1}^{H}W_{ij}h_j(n)=\sum_{j=1}^{H}W_{ij}f_j(\|X(n)-C_j\|) \quad (2)$$

for (i=1, 2, . . . , L) and where L is the element number of the output of the output layer and $W_{ij}$ is the connection weight between the j'th element in the hidden layer and the i'th element in the output layer.

Generally, a neural network architecture (e.g., the neural network 150 of FIG. 1D) may include a number of elements and may have center vectors which are distributed in the input domain such that the neural network may approximate nonlinear multidimensional functions and therefore may approximate forward mapping an inverse mapping between two data types (e.g., from an N-bit input encoded data to an N-bit output error-reduced version of encoded data). Generally, the choice of transfer function used by elements in the hidden layer may not affect the mapping performance of the neural network, and accordingly, a function may be used which may be implemented conveniently in hardware in some examples. For example, a thin-plate-spline function and/or a Gaussian function may be used in various examples and may both provide adequate approximation capabilities. Other functions may also be used.

Examples of neural networks may accordingly be specified by attributes parameters). In some examples, two sets of parameters may be used to specify a neural network: connection weights and center vectors (e.g., thresholds). The parameters may be determined from selected input data (e.g., encoded data) by solving an optimization function. An example optimization function may be given as:

$$E=\sum_{n=1}^{M}\|Y(n)-\widehat{Y(n)}\|^2 \quad (3)$$

where M is a number of trained input vector (e.g., trained encoded data inputs) and Y(n) is an output vector computed from the sample input vector using Equations (1) and (2) above, and $\widehat{Y(n)}$ is the corresponding desired (e.g., known) output vector. The output vector Y(n) may be written as:

$$Y(n)=[y_1(n),y_2(n),\ldots y_L(n)]^T$$

Various methods (e.g., gradient descent procedures) may be used to solve the optimization function. However, in some examples, another approach may be used to determine the parameters of a neural network, which may generally include two steps—(1) determining center vectors $C_i$ (i=1, 2, . . . , H) and (2) determining the weights.

In some examples, the center vectors may be chosen from a subset of available sample vectors. In such examples, the number of elements in the hidden layer(s) may be relatively large to cover the entire input domain. Accordingly, in some examples, it may be desirable to apply k-means cluster algorithms. Generally, k-means cluster algorithms distribute the center vectors according to the natural measure of the attractor (e.g., if the density of the data points is high, so is the density of the centers). k-means cluster algorithms may find a set of cluster centers and partition the training samples into subsets. Each cluster center may be associated with one of the H hidden layer elements in this network. The data may be partitioned in such a way that the training points are assigned to the cluster with the nearest center. The cluster center corresponding to one of the minima of an optimization function. An example optimization function for use with a k-means cluster algorithm may be given as:

$$E_{k\_means}=\sum_{j=1}^{H}\sum_{n=1}^{M}B_{jn}\|X(n)-C_j\|^2 \quad (4)$$

where $B_{jn}$ is the cluster partition or membership function forming an H×M matrix. Each column may represent an available sample vector (e.g., known input data) and each row may represent a cluster. Each column may include a single '1' in the row corresponding to the cluster nearest to that training point, and zeros elsewhere.

The center of each cluster may be initialized to a different randomly chosen training point. Then each training example may be assigned to the element nearest to it. When all training points have been assigned, the average position of the training point for each cluster may be found and the cluster center is moved to that point. The clusters may become the desired centers of the hidden layer elements.

In some examples, for some transfer functions (e.g., the Gaussian function), the scaling factor σ may be determined, and may be determined before determining the connection weights. The scaling factor may be selected to cover the training points to allow a smooth fit of the desired network outputs. Generally, this refers to any point within the convex hull of the processing element centers may significantly activate more than one element. To achieve this goal, each hidden layer element may activate at least one other hidden layer element to a significant degree. An appropriate method to determine the scaling parameter a may be based on the P-nearest neighbor heuristic, which may be given as, $$\sigma_i = \frac{1}{P}\sum_{j=1}^{P} \|C_j - C_i\|^2$$

(i=1, 2, . . . , H) where $C_j$ (for i=1, 2, . . . , H) are the P-nearest neighbors of $C_i$.

The connection weights may additionally or instead be determined during training. In an example of a neural network, such as neural network 150 of FIG. 1D, having one hidden layer of weighted connections an output elements which are summation units, the optimization function of Equation (3) may become a linear least-squares problem once the center vectors and the scaling parameter have been determined. The linear least-squares problem may be written as $$\min_{W}\sum_{n=1}^{M} \|Y(n) - \tilde{Y}(n)\|^2 = \min_{W}\sum_{n=1}^{M} \|WF - \hat{Y}\|^2 \quad (5)$$

where W={Wij} is the L×H matrix of the connection weights, F is an H×M matrix of the outputs of the hidden layer processing elements and whose matrix elements are computed using $F_{in}=f_i(\|X(n)-C_i\|)$ (i=1, 2, . . . , H; n=1, 2, . . . , M) and $\hat{Y}=[\hat{y}(1), \hat{y}(2), . . . , \hat{y}(M)]$ is the L×M matrix of the desired (e.g., known) outputs. The connection weight matrix W may be found from Equation (5) and may be written as follows:

$$\widetilde{W} = \widehat{Y}F^+ = \widehat{Y}\lim_{\alpha \to 0}F^T(FF^T + \alpha I)^{-1} \quad (6)$$

where $F^+$ is the pseudo-inverse of F. In this manner, the above may provide a batch-processing method for determining the connection weights of a neural network. It may be applied, for example, where all input sample sets are available at one time. In some examples, each new sample set may become available recursively, such as in the recursive-least-squares algorithms (RLS). In such cases, the connection weights may be determined as follows.

First, connection weights may be initialized to any value (e.g., random values may be used). The output vector Y(n) may be computed using Equation (2). The error term $e_i(n)$ of each output element in the output layer may be computed as follows:

$$e_i(n)=y_i(n)-\hat{y}_i(n)(i=1,2,\ldots,L)$$

The connection weights may then be adjusted based on the error term, for example as follows:

$$W_{ij}(n+1)=W_{ij}(n)+\gamma e_i(n)f_j(\|X(n)-C_i\|)$$

$$(i=1,2,\ldots,L;j=1,2,\ldots M) \quad (7)$$

where γ is the learning-rate parameter which may be fixed or time-varying.

The total error may be computed according to the output from the output layer and the desired (known) data:

$$\epsilon=\|Y(n)-\hat{Y}(n)\|^2 \quad (8)$$

The process may be iterated by again calculating a new output vector, error term, and again adjusting the connection weights. The process may continue until weights are identified which reduce the error to equal to or less than a threshold error.

Accordingly, the neural network 150 of FIG. 1D may be trained to determine parameters (e.g., weights) for use by the neural network 150 to perform a particular mapping between input encoded data and output an error-reduced version of encoded data. For example, training the neural network 150 may provide one set of parameters (e.g., weights) to use when reducing error present in encoded data (e.g., due to storage or transmission thereof) that had been encoded with a particular encoding technique (e.g., low density parity check coding (LDPC), Reed-Solomon coding, Bose-Chaudhuri-Hocquenghem (BCH), and/or Polar coding). The neural network 150 (and/or another neural network) may be trained multiple times, using different known input/output data pairs, for example. Multiple trainings may result in multiple sets of connection weights. For example, a different set of weights may be determined for each of multiple encoding techniques e.g., one set of weights may be determined for use with decoding LDPC encoded data and another set of weights may be determined for use with decoding BCH encoded data. Accordingly, in various implementations, the various sets of weights may correspond to weights used to estimate an error-reduced version of encoded data based on a received version of encoded data, to facilitate providing decoded data, e.g., with reduced errors present.

Recall that the stricture of neural network 150 of FIG. 1D is provided by way of example only. Other multilayer neural network structures may be used in other examples. For example, as described below with respect to FIG. 1E, a multilayer recurrent neural network structure may be utilized as disclosed herein. Moreover, the training procedures described herein are also provided by way of example. Other training techniques (e.g., learning algorithms) may be used, for example, to solve the local minimum problem and/or vanishing gradient problem. Determined weights and/or vectors for each decoder may be obtained by an off-line learning mode of the neural network, which may advantageously provide more resources and data. In some implementations, for example as described with reference to FIGS. 2A-2C, the hidden layers of combiners (e.g., combiner 152, combiner 154, combiner 156, and combiner 158) may include multiplication/accumulation (MAC) units, with each layer having additional MAC units. Such implementations, having accumulated the intermediate processing results in a respective processing elements (e.g., the respective MAC unit), may also include memory look-up (MLU) units that are configured to retrieve a plurality of coefficients and provide the plurality of coefficients as the connection weights (e.g., determined weights) for that respective layer of MAC units to be mixed with the input data.

In examples of supervised learning, the input training samples: $[x_1(n), x_2(n), \ldots x_m(n)]$ may be generated by passing the encoded samples $[b_1(n), b_2(n), \ldots b_m(n)]$ through some noisy channels and/or adding noise. The supervised output samples may be the corresponding original code $[a_1(n), a_2(n), \ldots a_L(n)]$ which may be used to generate $[b_1(n), b_2(n), \ldots b_m(n)]$ by the encoder. Once these parameters are determined in offline mode, the desired decoded code-word can be obtained from input data utilizing the neural network (e.g., computing Equation (2)), which may avoid complex iterations used in traditional error-correcting decoding algorithms. In this manner, neural networks described herein may provide a reduction in processing complexity and/or latency, because some complexity has been transferred to an off-line training process which is used to determine the weights and/or functions which will be used. Further, the same neural network (e.g., the neural network 150 of FIG. 1D) can be used to estimate an error-reduced version of encoded data based on an input code-word encoded from any of multiple error correction encoder by selecting different weights that were obtained by the training for the particular error correction technique employed.

Figure 1E:
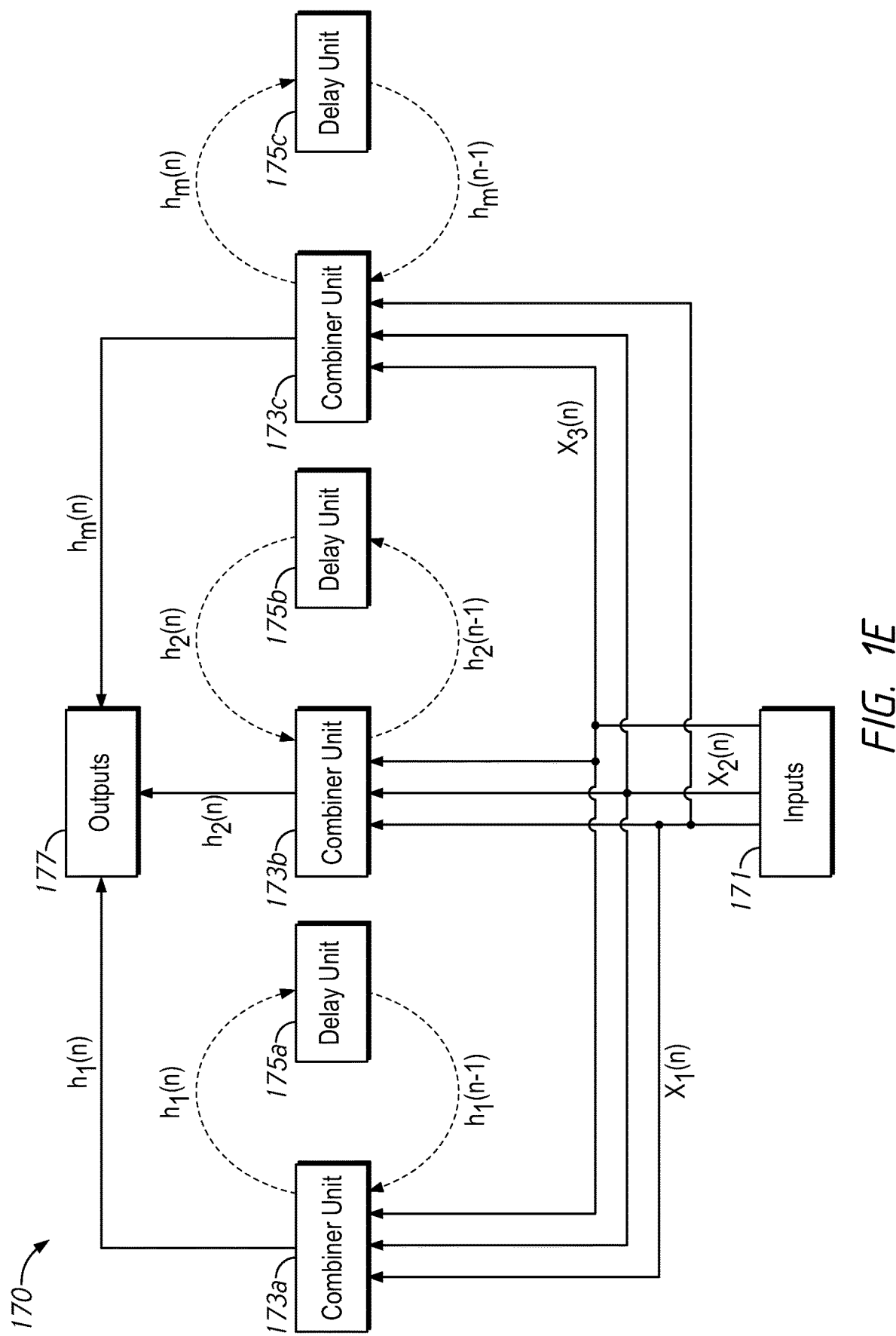
FIG. 1E is a schematic illustration of a recurrent neural network arranged in accordance with examples described herein.

FIG. 1E is a schematic illustration of a recurrent neural network arranged in accordance with examples described herein. The neural network 170 include three stages (e.g., layers): an inputs node 171; a combiner stage 173 and 175, and an outputs node 177, While three stages are shown in FIG. 1E, any number of stages may be used in other examples, e.g., as described with reference to FIGS. 2A-2C, Details of example implementations of neural network 170, in the context of FIGS. 2A-2C, will be presented in the description of FIGS. 2A-2C. In some implementations, the neural network 170 may have multiple combiner stages such that outputs from one combiner stage is provided to another combiners stage, until being providing to an outputs node 177. As described with reference to FIG. 2A, for example, there may be multiple combiner stages in a neural network 170. As depicted in FIG. 1E, the delay units 175a, 175b, and 175c may be optional components of the neural network 170. When such delay units 175a, 175b, and 175c are utilized as described herein, the neural network 170 may be referred to as a recurrent neural network.

The first stage of the neural network 170 includes inputs node 171. The inputs node 171 may receive input data at various inputs of the recurrent neural network. In some examples, the inputs node 171 may include multiple input nodes, such as input node 168, node 169, node 172, and node 174 of FIG. 1E. The second stage of the neural network 170 is a combiner stage including combiner units 173a, 173b, 173c; and delay units 175a, 175b, 175c. Accordingly, the combiner units 173 and delay units 175 may be collectively referred to as a stage of combiners. In some implementations, the combiner units 173a, 173b, and 173c may corresponds to combiner 152, combiner 154, and combiner 156 of FIG. 1D, for example. Accordingly, as described with respect to FIG. 1C with processing circuitry 112 implementing such combiners, generally processing circuitry 112 that implements the combiner units 173a-c and delay units 175a-c in the second stage may perform a nonlinear activation function using the input data from the inputs node 171 (e.g., input signals $X_1(n)$, $X_2(n)$, and $X_3(n)$). The third stage of neural network 170 includes the outputs node 177. In some examples, the outputs node 177 may include combiner 160, combiner 162, and combiner 164 of FIG. 1D. Accordingly, in some examples, the outputs nodes 177 may be referred to as a stage of combiners. Additional, fewer, and/or different components may be used in other examples.

The recurrent neural network 170 includes delay units 175a, 175b, and 175c, which generate delayed versions of the output from the respective combiner units 173a-c based on receiving such output data from the respective combiner units 173a-c. In the example, the output data of combiner units 173a-c may be represented as h(n); and, accordingly, each of the delay units 175a-c delay the output data of the combiner units 173a-c to generate delayed versions of the output data from the combiner units 173a-c, which may be represented as h(n−t). In various implementations, the amount of the delay, t, may also vary, e.g., one clock cycle, two clock cycles, or one hundred clock cycles. That is, the delay unit 175 may receive a clock signal and utilize the clock signal to identify the amount of the delay. In the example of FIG. 1E, the delayed versions are delayed by one time period, where '1' represents a time period. A time period may correspond to any number of units of time, such as a time period defined by a clock signal or a time period defined by another element of the neural network 170.

Continuing in the example of FIG. 1E, each delay unit 175a-c provides the delayed versions of the output data from the combiner units 173a-c as input to the combiner units 173a-c, to operate, optionally, as a recurrent neural network. Such delay units 175a-c may provide respective delayed versions of the output data from nodes of the combiner units 173a-c to respective input units/nodes of the combiner units 173a-c. In utilizing delayed versions of output data from combiner units 173a-c, the recurrent neural network 170 may train weights at the combiner units 173a-c that incorporate time-varying aspects of input data to be processed by such a recurrent neural network 170. Once trained, in some examples, the inputs node 171 receives input encoded data that is to be processed in the recurrent neural network 170. For example, each stream of input data may correspond to a different obtained set of encoded data that is representative of a temporal signal. Because an RNN 170 incorporates the delayed versions of output data from combiner units 173a-c, the delayed versions of output data from the combiner units 173a-c provide feedback information representative of the temporal nature, with the RNN 170 providing output decoded faster with the RNN 170 incorporating that temporal nature into calculating the output decoded data. In the example, the output decoded data may be representative of an estimate of an error-reduced version of encoded data, e.g., based on a received version of encoded data that was encoded according to the associated encoding technique.

Generally, a recurrent neural network may include multiple stages of nodes. The nodes may be implemented using processing circuitry 112 which may execute one or more functions on inputs received from a previous stage and provide the output of the functions to the next stage of the recurrent neural network. The processing units may be implemented using, for example, one or more processors, controllers, and/or custom circuitry, such as an application specific integrated circuit (ASIC) and/or a field programmable gate array (FPGA). In some examples, the processing units may be implemented using any of the processing circuitry 112 described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 170 may be implemented by the electronic device 110 utilizing any combination of one or more processing units described with respect to FIGS. 2A-2C.

Examples of recurrent neural network training and inference can be described mathematically. Again, as an example, consider input data at a time instant (n), given as: $X(n)=[x_1(n), x_2(n), \ldots x_N(n)]^T$. The center vector for each element in hidden layer(s) of the recurrent neural network 170 (e.g., combiner units 173 including combiner 152, combiner 154, combiner 156, and combiner 158 of FIG. 1D) may be denoted as $C_i$ (for i=1, 2, ..., H, where H is the element number in the hidden layer).

The output of each element in a hidden layer may then be given as:

$$h_i(n)=f_i(\|X(n)+h_i(n-t)-C_i\|) \text{ for } (i=1,2,\ldots H) \qquad (9)$$

t may be the delay at the delay unit 175 such that the output of the combiner units 173 includes a delayed version of the output of the combiner units 173, In some examples, this may be referred to as feedback of the combiner units 173. Accordingly, each of the connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$mp_i(n) = \sum_{j=1}^{H} W_{ij}h_j(n) + W_{ij}h_j(n-t) = \sum_{j=1}^{H} W_{ij}f_i(\|X(n) + h_i \cdot (n-t) - C_j\|) \quad (10)$$

for (i=1, 2, . . . , L) and where L is the element number of the output of the output layer and $W_{ij}$ is the connection weight between the j'th element in the hidden layer and the i'th element in the output layer.

Additionally or alternatively, while FIG. 1E has been described with respect to a single stage of combiners (e.g., second stage) including the combiner units 173a-c and delay units 175a-c, it can be appreciated that multiple stages of similar combiner stages may be included in the neural network 170 with varying types of combiner units and varying types of delay units with varying delays, for example, as will now be described with reference to FIGS. 2A-2C. Further, the same neural network (e.g., the neural network 170 of FIG. 1E) can be used to facilitate decoding of encoded data from any of multiple error correction encoder by selecting different weights that were obtained by the training for the particular error correction technique employed. In the example, different weights may correspond to particular weights used to estimate an error-reduced version of encoded data based on a received version of encoded data of a particular error correction technique employed. In this manner, recurrent neural networks may serve as a an error reduction recurrent neural network (e.g., error reduction NN 56) for multiple encoder types, like the neural network 150. In an example implementation, the recurrent neural network 170 may be used to implement the error reduction NN 56. Advantageously, the recurrent neural network 170 utilizes delayed versions of output data from combiner units 173a-c, to provide feedback information representative of a temporal nature. As such, the RNN 170 may provide output data decoded faster with the RNN 170, e.g., as compared to the neural network 150. For example, if a particular encoding technique is susceptible to noise during storing in a memory 140 or memory 145 (e.g., bit flips), obtained encoded data to be decoded by the RNN 170 may include noise that produces a time-varying effect on the obtained encoded data (e.g., temporal nature). Accordingly, the feedback information included in the delayed versions of output data may improve the efficiency of the RNN 170 (e.g., as compared to a neural network 150), to reduce error present in encoded data, e.g., in using an estimate of an error-reduced version of encoded data based on a received version encoded data that is associated with an encoding technique. Advantageously, the error-reduced version of the encoded data, provided as an estimate of (e.g., equivalent to) encoded data (b1, b2, . . . bN) by a RNN 170, may include a reduction of a bit error rate (BER) or an increase of a signal-to-noise ratio (SNR) as compared to a respective BER or SNR of a received version of encoded data (x1, x2, . . . xN).

Figure 2A:
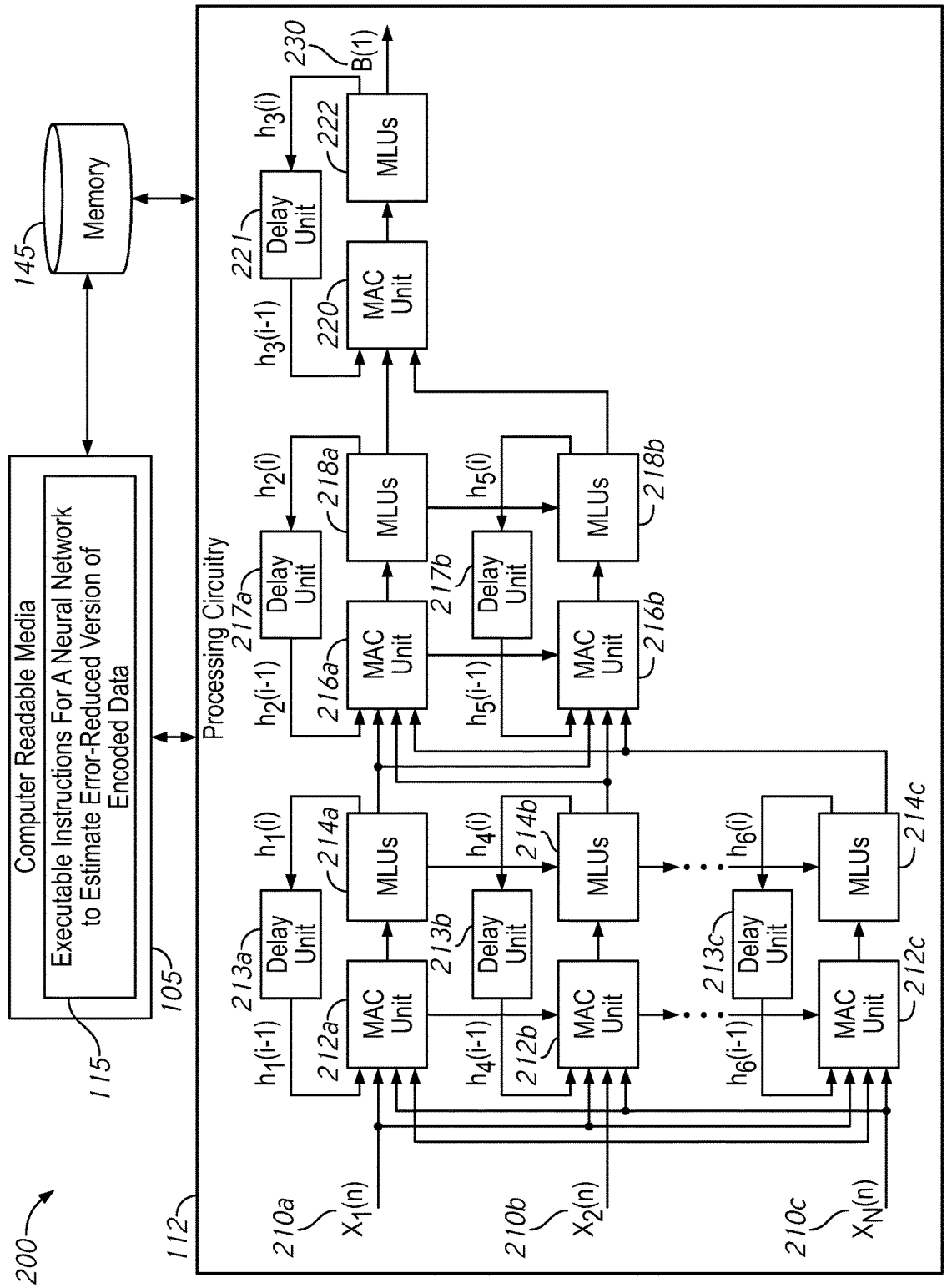
FIGS. 2A-2C are schematic illustrations of processing circuitry arranged in systems in accordance with examples described herein.

FIG. 2A is a schematic illustration of processing circuitry 112 arranged in a system 200 in accordance with examples described herein. Such a hardware implementation (e.g., system 200) may be used, for example, to implement one or more neural networks, such as error reduction NN 56 of FIG. 1B, the neural network 150 of FIG. 1D, or the recurrent neural network 170 of FIG. 1E. Additionally or alternatively, in some implementations, the processing circuitry 112 may receive input data 210a, 210b, and 210c from such a computing system. The input data 210a, 210b, and 210c may be encoded data obtained from a sensor or data stored in the memory 145. Accordingly, the input data obtained may be N bits of noisy encoded data that is provided to an input stage (e.g., an input layer) of the processing unit, with the input data 210a $X_1(i)$ corresponding to the first bit; the input data 210b $X_2(i)$ corresponding to the second bit; and the input data 210c $X_{IN}(i)$ corresponding to the N'th bit. In some examples, the obtained input data may be data encoded in accordance with an encoding technique (e.g., low density parity check coding (LDPC), Reed-Solomon coding, Bose-Chaudhuri-Hocquenghem (BCH), and/or Polar coding).

Processing circuitry 112 may implement an error reduction functionality or an estimating operation for the received encoded data at an electronic device 110 so as to output an estimate of an error-reduced version of encoded data (e.g., B(1) 230). In various implementations, processing circuitry 112 may implement an error reduction NN, such as error reduction NN 56 depicted in FIG. 1B. Accordingly, processing circuitry 112 of FIG. 2A, implementing an error reduction NN, may be referred to as a recurrent neural network.

Additionally or alternatively, in some implementations, the input data may be noisy due to noise experienced during storing of the encoded data in the memory 140 or memory 145 (e.g., bit flips). For example, encoded data stored in the memory 140 or memory 145 may be obtained as input data to be provided to the electronic device 110 in which the processing circuitry 112 is implemented.

The processing circuitry 112 may include multiplication unit/accumulation (MAC) units 212a-c, 216a-b, and 220; delay units 213a-c, 217a-b, and 221; and memory lookup units (MLUs) 214a-c, 218a-b, and 222 that, when mixed with input data obtained from the memory 145, may generate output data (e.g. B (1)) 230. Each set of MAC units and MLU units having different element numbers may be referred to as a respective stage of combiners for the processing circuitry 112. For example, a first stage of combiners includes MAC units 212a-c and MLUs 214a-c, operating in conjunction with delay units 213a-c, to form a first stage or "layer," as referenced with respect to FIG. 1D having "hidden" layers as various combiner stages, Continuing in the example, the second stage of combiners includes MAC units 216a-b and MLUs 218a-b, operating in conjunction with delay units 217a-b, to form a second stage or second layer of hidden layers. And the third stage of combiners may be a single combiner including the MAC unit 220 and MLU 222, operating in conjunction with delay unit 221, to form a third stage or third layer of hidden layers.

In context of neural network 150 of FIG. 1D for example, the first stage of combiners of processing circuitry 112 including MAC units 212a-c and MLUs 214a-c operating in conjunction with delay units 213a-c can correspond to combiner 152, combiner 154, combiner 156, and combiner 158, which is the second stage of neural network 150. Continuing in example, as described with respect to the neural network 150, it may include additional stages or hidden layers in various embodiments, such that the combiner 160, combiner 162, combiner 164, or combiner 166 corresponds to the single combiner of FIG. 2A, including the MAC unit 220 and MLU 222, Similarly, in an example within the context of recurrent network 170 of FIG. 1E, the first stage of combiners of processing circuitry 112—including MAC units 212a-c operating in conjunction with delay units 213a-c—can correspond to the combiner stage of recurrent neural network 170 including combiner units 173a, 173b, 173c; and delay units 175a, 175b, 175c.

In an example of input data being processed into an error-reduced version of encoded data, the output data 230 B(1) may be an estimate of an error-reduced version of encoded data in some examples. In operation, the processing circuitry 112, may implement executable instructions 115 for a neural network to estimate an error-reduced version of encoded data based on encoded data, stored at the computer readable media 105, to cause the processing circuitry 112 to configure the multiplication units 212a-c, 216a-c, and 220 to multiply and/or accumulate input data 210a, 210b, and 210c and delayed versions of processing results from the delay units 213a-c, 217a-b, and 221 (e.g., respective outputs of the respective layers of MAC units) with coefficient data to generate the output data 230 B(1). For example, the executable instructions 115 may cause the memory 145 to provide weights and/or other parameters stored in the memory 145, which may be associated with a certain encoding technique, to the MLUs 214a-c, 218a-b, and 222 as weights for the MAC units 212a-c, 216a-b, and 220 and delay units 213a-c, 217a-b, and 221. Accordingly, during operation, the processing circuitry 112 may implement the executable instructions 115 to select certain coefficient data (e.g., a plurality of coefficients) as weights from memory 145 based on an indicated encoding technique of the received encoded data.

In an example of executing such instructions 115 for a neural network to estimate an error-reduced version of encoded data, the instructions 115 may include mixing encoded data with a plurality of coefficients or weights (e.g., stored as weights 118 in computer readable media 105), at a first layer of the MAC units 212a-c and MLUs 214a-c, the multiplication unit/accumulation units 212a-c are configured to multiply and accumulate at least two operands from corresponding input data 210a, 210b, or 210c and an operand from a respective delay unit 213a-c to generate a multiplication processing result that is provided to the MLUs 214a-c. For example, the multiplication unit/accumulation units 212a-c may perform a multiply-accumulate operation such that three operands, MN, and T are multiplied and then added with P to generate a new version of P that is stored in its respective MLU 214a-c. Accordingly, the MLU 214a latches the multiplication processing result, until such time that the stored multiplication processing result is be provided to a next layer of MAC units. The MLUs 214a-c, 218a-b, and 222 may be implemented by any number of processing elements that operate as a memory look-up unit such as a D, T, SR, and/or JK latches.

The MLUs 214a-c, 218a-b, and 222 shown in FIG. 2A may generally perform a predetermined nonlinear mapping from input to output. For example, the MLUs 214a-c, 218a-b, and 222 may be used to evaluate at least one non-linear function. In some examples, the contents and size of the various MLUs 214a-c, 218a-b, and 222 depicted may be different and may be predetermined. In some examples, one or more of the MLUs 214a-c, 218a-b, and 222 shown in FIG. 2A may be replaced by a single consolidated MLU (e.g., a table look-up). Examples of nonlinear mappings (e.g., functions) which may be performed by the MLUs 214a-c, 218a-b, and 222 include Gaussian functions, piecewise linear functions, sigmoid functions, thin-plate-spline functions, multiquadratic functions, cubic approximations, and inverse multi-quadratic functions. Examples of functions have been described with reference also to FIG. 1D. In some examples, selected MLUs 214a-c, 218a-b, and 222 may be by-passed and/or may be de-activated, which may allow an MLU and its associated MAC unit to be considered a unity gain element.

Additionally in the example, the MLU 214a provides the processing result to the delay unit 213a. The delay unit 213a delays the processing result (e.g., $h_1(i)$) to generate a delayed version of the processing result (e.g., $h_1(i-1)$) to output to the MAC unit 212a as operand T. While the delay units 213a-c, 217a-b, and 221 of FIG. 2A are depicted introducing a delay of '1', it can be appreciated that varying amounts of delay may be introduced to the outputs of first layer of MAC units. For example, a clock signal that introduced a sample delay of '1' (e.g., $h_1(i-1)$) may instead introduce a sample delay of '2', '4', or '100'. In various implementations, the delay units 213a-c, 217a-b, and 221 may correspond to any number of processing units that can introduce a delay into processing circuitry using a clock signal or other time-oriented signal, such as flops (e.g., D-flops) and/or one or more various logic gates (e.g., AND, OR, NOR, etc . . . ) that may operate as a delay unit.

In the example of a first hidden layer of a recurrent neural network, the MLUs 214a-c may retrieve coefficient data stored in the memory 145, which may be weights associated with weights to be applied to the first layer of MAC units to both the data from the current period and data from a previous period (e.g., the delayed versions of first layer processing results). For example, the MLU 214a can be a table look-up that retrieves one or more coefficients to be applied to both operands M and N, as well as an additional coefficient to be applied to operand T. The MLUs 214a-c also provide the generated multiplication processing results to the next layer of the MAC units 216a-b and MLUs 218a-b. The additional layers of the MAC units 216a, 216b and MAC unit 220 working in conjunction with the MLUs 218a, 218b and MLU 222, respectively, may continue to process the multiplication results to generate the output data 230 B(1). Using such a circuitry arrangement, the output data 230 B(1) may be generated from the input data 210a, 210b, and 210c.

Figure 2B:
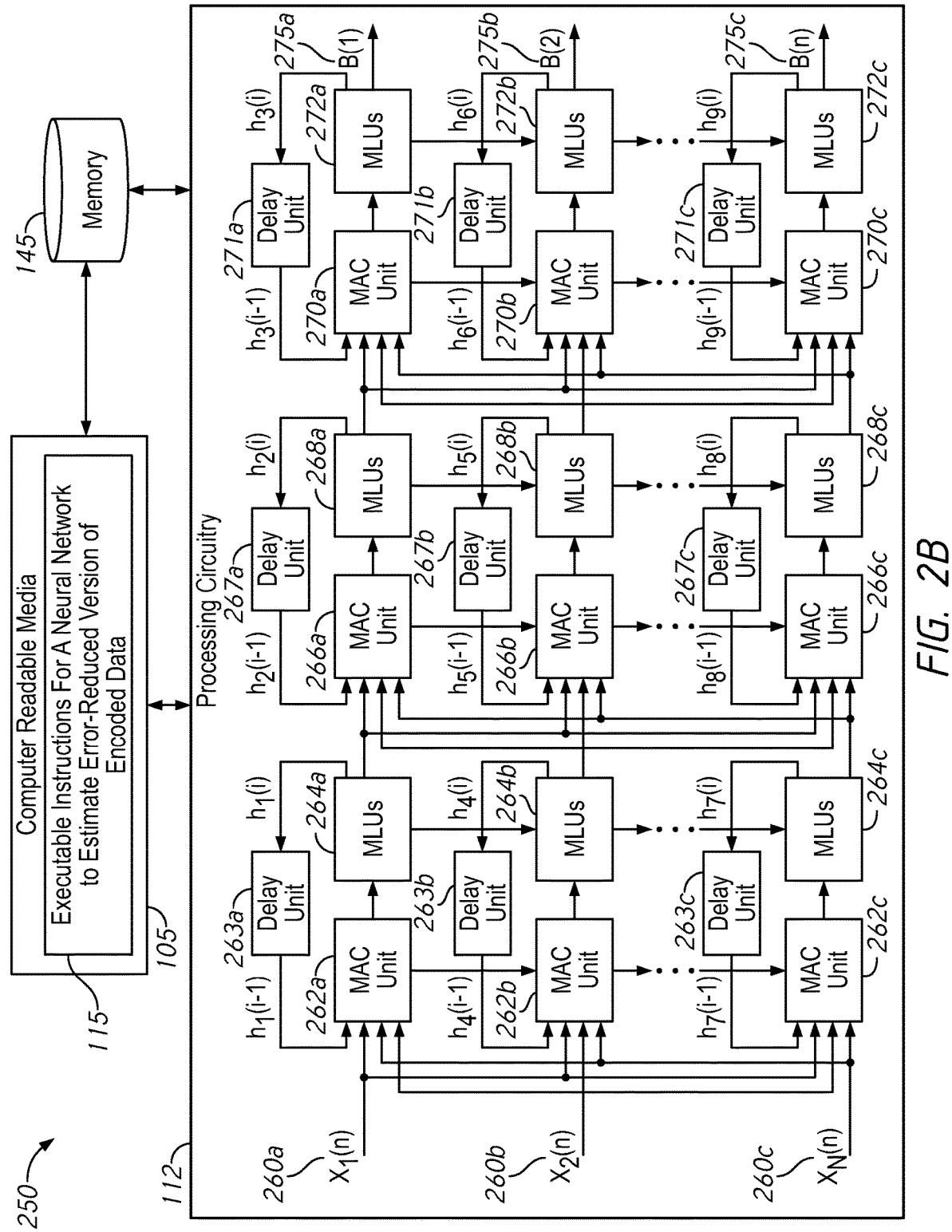

Advantageously, the processing circuitry 112 of system 200 may utilize a reduced number of MAC units and/or MLUs, e.g., as compared to the processing circuitry 112 of FIG. 2B, Each subsequent layer may have a reduced portion of MAC units, delay units, and MLUs. As depicted, in FIG. 2A for example, a second layer of MAC units 216a-b, delay unit 217a-b, and MLUs 218a-b may include m−1 MAC units and MLUs, when m=3. Accordingly, the last layer in the processing circuitry 112, including the MAC unit 220, delay unit 221, and MLU 222, includes only one MAC, one delay unit, and one MLU.

The plurality of coefficients, for example from memory 145, can be mixed with the input data 210a-210c and delayed version of processing results to generate the output data 230 B(1). For example, the relationship of the plurality of coefficients to the output data 230 B(1) based on the input data 210a-c and the delayed versions of processing results may be expressed as:

$$B(1) = a^1 * f(\Sigma_{j=1}^{m-1} a^{(m-1)} f_j(\Sigma_{k=1}^{m} a^{(m)} X_k(i))) \qquad (11)$$

where $a^{(m)}$, $a^{(m-1)}$, $a^1$ are coefficients for the first layer of multiplication/accumulation units 212a-c and outputs of delay units 213a-c; the second layer of multiplication/accumulation units 216a-b and outputs of delay units 217a- b; and last layer with the multiplication/accumulation unit 220 and output of delay unit 221, respectively; and where f(●) is the mapping relationship which may be performed by the memory look-up units 214a-c and 218a-b. As described above, the memory look-up units 214a-c and 218a-b retrieve coefficients to mix with the input data and respective delayed versions of each layer of MAC units. Accordingly, the output data may be provided by manipulating the input data and delayed versions of the MAC units with the respective multiplication/accumulation units using one or more pluralities of coefficients stored in the memory. The pluralities of coefficients may be specific to an iterative decoding technique associated with the encoded data. The resulting mapped data may be manipulated by additional multiplication/accumulation units and additional delay units using additional sets of coefficients stored in the memory associated with the desired encoding technique. Accordingly, pluralities of coefficients multiplied at each stage of the processing circuitry 112 may represent or provide an estimation of the processing of the input data in specifically-designed hardware e.g., an FPGA).

Each of the multiplication unit/accumulation units 212a-c, 216a-b, and 220 may include multiple multipliers, multiple accumulation unit, or and/or multiple adders. Any one of the multiplication unit/accumulation units 212a-c, 216a-b, and 220 may be implemented using an ALU. In some examples, any one of the multiplication unit/accumulation units 212a-c, 216a-b, and 220 can include one multiplier and one adder that each perform, respectively, multiple multiplications and multiple additions. The input-output relationship of a multiplication/accumulation unit 212a-c, 216a-b, and 220 may be represented as:

$$B_{out} = \sum_{i=1}^{I} C_i * B_{in}(i) \quad (12)$$

where "I" represents a number to perform the multiplications in that unit, $C_i$ the coefficients which may be accessed from a memory, such as memory 145, and $B_{in}(i)$ represents a factor from either the input data 210a-c or an output from multiplication unit/accumulation units 212a-c, 216a-b, and 220. In an example, the output of a set of multiplication unit/accumulation units, $B_{out}$, equals the sum of coefficient data, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of coefficient data, $C_i$ multiplied by input data.

While described in FIG. 2A as processing circuitry 112 implementing an error reduction NN 56 as a recurrent neural network, it can be appreciated that processing circuitry 112, described herein, may estimate an error-reduced version of encoded data based on a received version of encoded data, e.g., as implemented in any recurrent neural network or to perform any error reduction functionality of an error reduction NN (e.g., error reduction NN 56).

FIG. 2B is a schematic illustration of a processing circuitry 112 arranged in a system 250 in accordance with examples described herein. Such a hardware implementation (e.g., system 250) may be used, for example, to implement one or more neural networks, such as error reduction NN 56 of FIG. 1B, the neural network 150 of FIG. 1D, or the recurrent neural network 170 of FIG. 1E. Processing circuitry 112 may implement an error reduction functionality or an estimating operation for the received encoded data at an electronic device 110 so as to output an estimate of an error-reduced version of encoded data (e.g., B(1) 275a, B(2) 275b, ... B(n) 275c). In various implementations, processing circuitry 112 may implement an error reduction neural network, such as error reduction NN 56 depicted in FIG. 1B. Accordingly, processing circuitry 112 of FIG. 2B, implementing an error reduction NN 56, may be referred to as a recurrent neural network.

Additionally or alternatively, in some implementations, the processing circuitry 112 may receive input data 210a, 210b, and 210c from a computing system. Similarly described elements of FIG. 2B may operate as described with respect to FIG. 2A, but may also include additional features as described with respect to FIG. 2B. For example, FIG. 2B depicts MAC units 262a-c and delay units 263a-c that may operate as described with respect MAC units 212a-c and delay units 213a-c of FIG. 2A. Accordingly, elements of FIG. 2B, whose numerical indicator is offset by 50 with respect to FIG. 2A, include similarly elements of the processing circuitry 112; e.g., MAC unit 266a operates similarly with respect to MAC unit 216a. The system 250, including processing circuitry 112, also includes additional features not highlighted in the processing circuitry 112 of FIG. 2A. For example, the processing circuitry 112 of FIG. 2B additionally includes MAC units 266c and 270b-c; delay units 267c and 271b-c; and MLUs 268c and 272b-c, such that the output data is provided as 275a-c, rather than as singularly in FIG. 2A as B(1) 230. Advantageously, the system 250 including a processing circuitry 112 may process the input data 260a-c to generate the output data 275a-c with greater precision. For example, the output data 275a-c may process the input data 260a-260c with additional coefficient retrieved at MLU 268c and multiplied and/or accumulated by additional MAC units 266c and 270b-c and additional delay units 267c and 271b-c. For example, such additional processing may result in output data that is more precise with respect providing output data that is an estimate of an error-reduced version of encoded data (e.g., as compared to output data obtained from the processing circuitry 112 of FIG. 2A). In implementations where board space (e.g., a printed circuit board) is not a primary factor in design, implementations of the processing circuitry 112 of FIG. 2B may be desirable as compared to that of processing circuitry 112 of FIG. 2A; which, in some implementations may occupy less board space as a result of having fewer elements than the processing circuitry 112 of FIG. 2B.

While processing circuitry 112 is described in the context of FIGS. 2A and 2B as a single processing circuitry 112, the features may also be implemented in the processing circuitry 112 of FIG. 1C, such that the description of the single processing circuitry 112 in FIG. 2A or 2B is interchangeable as a processing element as implemented throughout the examples described herein. Therefore, it can be appreciated that, while referring to a single processing circuitry 112 in FIG. 2A or 2B, the electronic device 110 may have multiple processing circuitry 112, like FIG. 1C, to also have the same features as described with respect a single processing circuitry 112 of FIG. 2A or 2B.

In context of neural network 150 of FIG. 1D for example, the first stage of combiners of processing circuitry 112 including MAC units 262a-c and WIN 264a-c operating in conjunction with delay units 263a-c can correspond to combiner 152, combiner 154, combiner 156, and combiner 158, which is the second stage of neural network 150. Continuing in example, as described with respect to the neural network 150, it may include additional stages or hidden layers in various embodiments, such that the combiner 160, combiner 162, combiner 164, or combiner 166 correspond to the MAC units 270a-c and MLUs 272a-c operating in conjunction with delay units 271a-c. Similarly, in an example within the context of recurrent network 170 of FIG. 1E, the first stage of combiners of processing circuitry 112 including MAC units 262a-c operating in conjunction with delay units 263a-c can correspond to the combiner stage of recurrent neural network 170 including combiner units 173a, 173b, 173c; and delay units 175a, 175b, 175c.

Figure 2C:
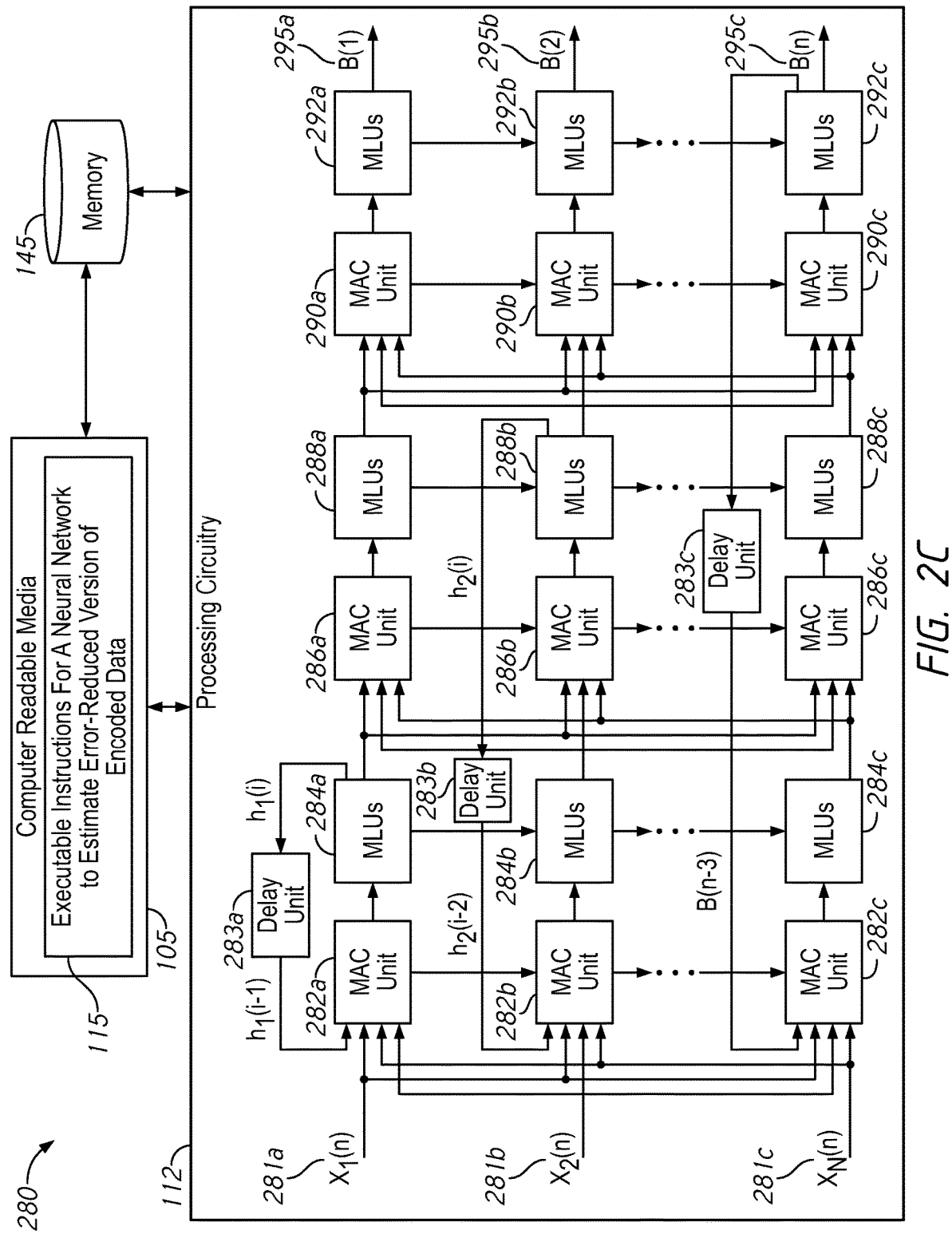

FIG. 2C is a schematic illustration of a processing circuitry 112 arranged in a system 280 in accordance with examples described herein. Such a hardware implementation (e.g., system 280) may be used, for example, to implement one or more neural networks, such as error reduction NN 56 of FIG. 1B, the neural network 150 of FIG. 1D, or the recurrent neural network 170 of FIG. 1E, Processing circuitry 112 may implement an error reduction functionality or an estimating operation for the received encoded data at an electronic device 110 so as to output an estimate of an error-reduced version of encoded data (e.g., B(1) 295a, B(2) 295b, . . . B(n) 295c). In various implementations, processing circuitry 112 may implement an error reduction neural network, such as error reduction NN 56 depicted in FIG. 1B. Accordingly, processing circuitry 112 of FIG. 2C, implementing an error reduction NN 56, may be referred to as a recurrent neural network.

Additionally or alternatively, in some implementations, the processor circuitry 112 may be implemented as a processing circuitry 112 in the example of FIG. 1C. Similarly described elements of FIG. 2C may operate as described with respect to FIG. 2B, except for the delay units 263a-c, 267a-c, and 271a-c of FIG. 2B. For example, FIG. 2C depicts MAC units 282a-c and delay units 283a-c that may operate as described with respect to MAC units 262a-c and delay units 263a-c of FIG. 2B. Accordingly, elements of FIG. 2C, whose numerical indicator is offset by 20 with respect to FIG. 2B, include similarly elements of the processing circuitry 112; e.g., MAC unit 286a operates similarly with respect to MAC unit 266a.

The system 280, including processing circuitry 112, also includes additional features not highlighted in the processing circuitry 112 of FIG. 2B. Different than FIG. 2B, FIG. 2C depicts delay units 283a, 283b, and 283c. Accordingly, the processing unit of FIG. 2C illustrate that processing circuitry 112 may include varying arrangements to the placement of the inputs and outputs of delay units, as illustrated with delay units 283a, 283b, and 283c. For example, the output of MLU 288b may be provided to delay unit 283b, to generate a delayed version of that processing result from the second layer of MAC units, as an input to the first layer of MAC units, e.g., as an input to MAC unit 282b. Accordingly, the processing circuitry 112 of system 280 is illustrative that delayed versions of processing results may be provided as inputs to other hidden layers, different than the processing circuitry 112 of system 250 in FIG. 2B showing respective delayed versions being provided as inputs to the same layer in which those delayed versions were generated (e.g., the output of MLU 268b is provided to delay unit 267b, to generate a delayed version for the MAC unit 266b in the same layer from which the processing result was outputted). Therefore, in the example, even the output B(n) 295c may be provided, from the last hidden layer, to the first hidden layer (e.g., as an input to MAC unit 282c).

Advantageously, such delayed versions of processing results, which may be provided as inputs to different or additional hidden layers, may better compensate "higher-order" memory effects in a recurrent neural network 170 that implements processing circuitry 112 of FIG. 2C, e.g., as compared to the processing circuitry 112 of FIG. 2A or 2B. For example, higher-order memory effects model the effects of leading and lagging envelope signals used during training of the recurrent neural network 170, to transform obtained noisy encoded data at the processing circuitry 112 into an estimate of an error-reduced version of encoded data. The received encoded data, in being stored in a memory 140 or memory 145 with noise (e.g., bit flips) or other noises experienced during storage (e.g., shot or voltage noise) may be noisy encoded data to be decoded, e.g., in part by the recurrent neural network 170 providing an estimate of an error-reduced version of encoded data. In the example, a recurrent neural network 170 that estimates the output data may include varying delayed versions of processing results that corresponds to such leading and lagging envelopes (e.g., of various envelopes encapsulating the noise(s)). Accordingly, implementing the processing circuitry 112 incorporates such higher-order memory effects, e.g., for an inference of a recurrent neural network 170, to provide an error-reduced version of encoded data as output data 295a-c based on input data 281a-c.

While processing circuitry 112 is described in the context of FIGS. 2A, 2B, and 2C as a single processing circuitry 112, the features may also be implemented in the processing circuitry 112 of FIG. 1C, such that the description of the single processing circuitry 112 in FIG. 2A, 2B, 2C is interchangeable in any processing circuitry, as implemented throughout the examples described herein. Therefore, it can be appreciated that, while referring to a single processing circuitry 112 in FIGS. 2A, 2B, 2C the electronic device 110 may have multiple processing circuitry 112, like FIG. 1C, to also have the same features as described with respect a single processing circuitry 112 of FIG. 2A, 2B, or 2C.

While described in FIGS. 2A, 2B and 2C as processing circuitry 112 implementing an error reduction NN 56 as a recurrent neural network, it can be appreciated that processing circuitry 112, described herein, may estimate an error-reduced version of encoded data based on a received version of encoded data, e.g., as implemented in any recurrent neural network or to perform any error reduction functionality of an error reduction NN (e.g., error reduction NN 56). In the example implementations, multiple processing circuitry 112 (e.g., one or more of any of the processing circuitry 112 depicted in FIGS. 2A-2C) are configured to receive encoded data and to generate an estimate of an error-reduced version of encoded data (xr1, xr2, . . . xrN). Advantageously, the estimate of an error-reduced version of encoded data set is equivalent to output from an encoder associated with the encoding technique (e.g., N bits of encoded data (b1, b2, . . . bN) output by the encoder 52). Accordingly, the processing circuitry 112 may facilitate the decoding of encoded data in implementing an error reduction NN (e.g., error reduction NN 56) to reduce error present in received version of encoded data. For example, the error-reduced version of the encoded data, provided as an estimate of (e.g., equivalent to) encoded data (b1, b2, . . . bN) by multiple processing circuitry 112, may include a reduction of a bit error rate (BER) or an increase of a signal-to-noise ratio (SNR) as compared to a respective BER or SNR of a received version of encoded data (x1, x2, . . . xN).

Figure 3:
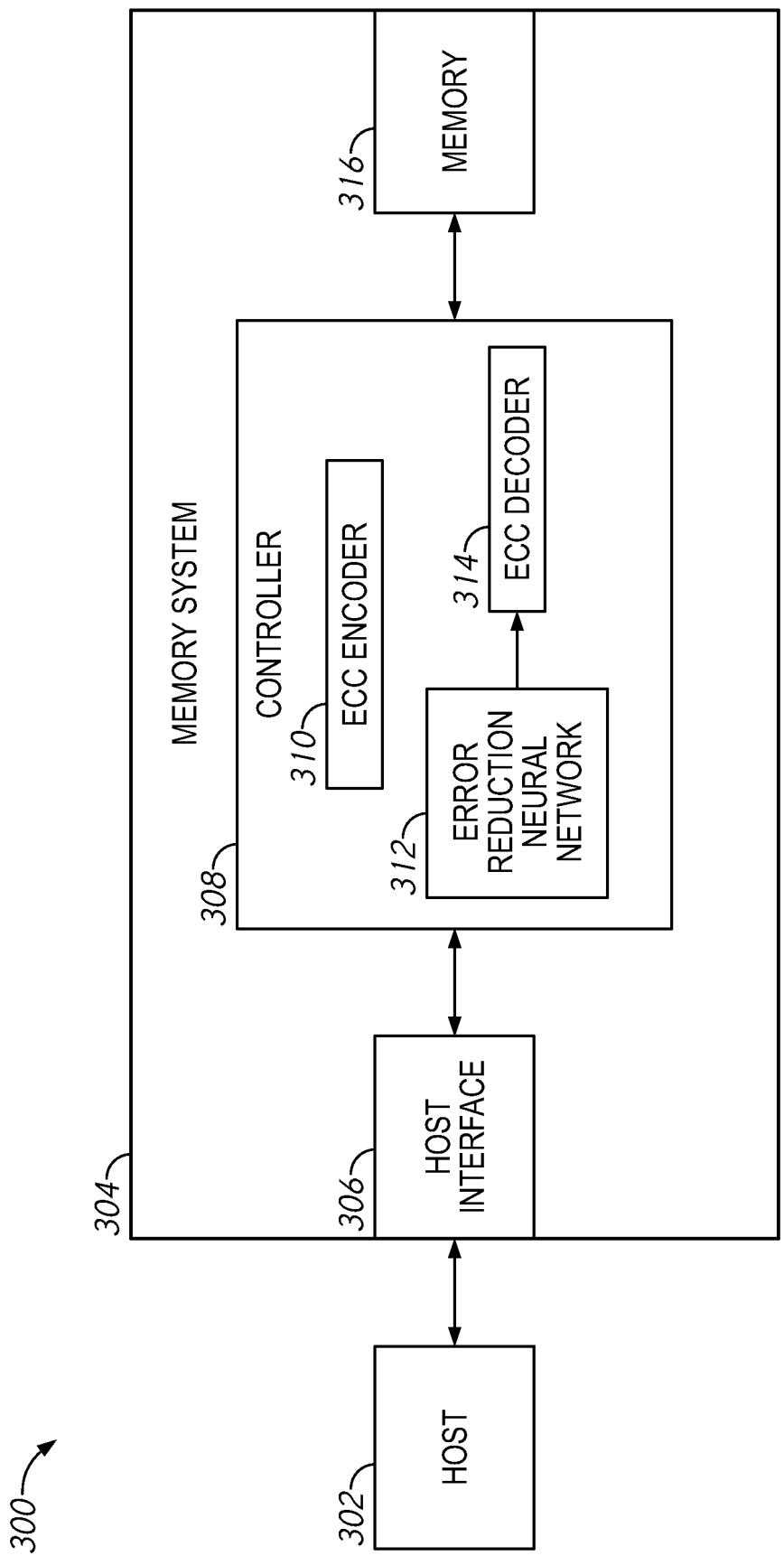
FIG. 3 is a schematic illustration of an apparatus arranged in accordance with examples described herein.

FIG. 3 is a schematic illustration of apparatus 300 (e.g., an integrated circuit, a memory device, a memory system, an electronic device or system, a smart phone, a tablet, a computer, a server, an appliance, a vehicle, etc.) according to an embodiment of the disclosure. The apparatus 300 may generally include a host 302 and a memory system 304.

The host 302 may be a host system such as a personal laptop computer, a desktop computer, a digital camera, a mobile telephone, or a memory card reader, among various other types of hosts. The host 302 may include a number of memory access devices (e.g., a number of processors). The host 302 may also be a memory controller, such as where memory system 304 is a memory device (e.g., a memory device having an on-die controller).

The memory system 304 may be a solid state drive (SSD) or other type of memory and may include a host interface 306, a controller 308 (e.g., a processor and/or other control circuitry), and a number of memory device 316. The memory system 304, the controller 308, and/or the memory device 316 may also be separately considered an "apparatus," The memory device 316 may include a number of solid state memory devices such as NAND flash devices, which may provide a storage volume for the memory system 304. Other types of memory may also be used.

The controller 308 may be coupled to the host interface 306 and to the memory device 316 via a plurality of channels to transfer data between the memory system 304 and the host 302. The interface 306 may be in the form of a standardized interface. For example, when the memory system 304 is used for data storage in the apparatus 300, the interface 306 may be a serial advanced technology attachment (SATA), peripheral component interconnect express (PCIe), or a universal serial bus (USB), among other connectors and interfaces. In general, interface 306 provides an interface for passing control, address, data, and other signals between the memory system 304 and the host 302 having compatible receptors for the interface 306.

The controller 308 may communicate with the memory device 316 (which in some embodiments can include a number of memory arrays on a single die) to control data read, write, and erase operations, among other operations. The controller 308 may include a discrete memory channel controller for each channel (not shown in FIG. 3) coupling the controller 308 to the memory device 316. The controller 308 may include a number of components in the form of hardware and/or firmware (e.g., one or more integrated circuits) and/or software for controlling access to the memory device 316 and/or for facilitating data transfer between the host 302 and memory device 316.

The controller 308 may include an FCC encoder 310 for encoding data bits written to the memory device 316 using one or more encoding techniques. The ECC encoder 310 may include a single parity check (SPC) encoder, and/or an algebraic error correction circuit such as one of the group including a Bose-Chaudhuri-Hocquenghem (BCH) ECC encoder and/or a Reed Solomon FCC encoder, among other types of error correction circuits. Accordingly, the FCC encoder 310 may store or provide encoded data to the memory device 316 based on operations implemented by the controller 308, e.g., for the host 302. During storage or transmission of the encoded data output by ECC 310, noise related to or from the memory controller 308 may be introduced into the encoded data. For example, during transmission or communication of encoded data in the memory system 304, the encoded data, which is communicated over a bus from the ECC encoder 310 to the memory device 316, may experience noise due to voltage or current disturbances in the memory controller 308 or more generally the memory system 304. Accordingly, the encoded data stored in the memory device 316 may be representative of a version of the N bits of encoded data (x1, x2, . . . xN) (e.g., as output from an encoder 14 of FIG. 1A).

The controller 308 may further include an error reduction neural network (NN) 312 and an ECC decoder 314 for decoding encoded data. The error reduction NN 312 and the FCC decoder 314 may operate in conjunction to facilitate providing decoded data based on encoded data from the ECC encoder 310, whether stored in the memory device 316 or received from the FCC encoder 310 directly to an input of the error reduction NN 312. In the example implementation, the similarly-named elements of FIG. 3, error reduction NN 312 and FCC decoder 314, may operate as described with respect to similarly-named elements of FIG. 1B (e.g., error reduction NN 56 and ECC decoder 58), but may also include additional features as described with respect to FIG. 3.

In the memory system 304, the controller 308 may execute memory commands, such that the encoded data stored in the memory device 316 is retrieved and decoded. In the example implementation, the memory device 316 may, for example, include one or more output buffers which may read encoded data from memory cells of the memory device 316. The output buffers may provide output data, which may be provided as encoded data to the error reduction NN 312. For example, once received as a version of encoded data at the error reduction NN 312, the error reduction NN 312 and the FCC decoder 314 may operate in conjunction to facilitate providing decoded data. During transmission from the memory device 316 to the error reduction NN 312, the encoded data may experience noise on the bus coupling the memory device 316 to the error reduction NN 312, e.g., due to voltage or current disturbances on the bus, in the memory controller 308, or more generally in the memory system 304.

Additionally or alternatively with respect to noise in the encoded data, storing N encoded data (b1, b2, . . . bN) in memory device 316 may introduce environmental or other noise. For example, noise may be introduced in storing the encoded data in memory device 316 that is degraded (e.g., due to bit flips). Accordingly, encoded data retrieved from the memory device 316 may be referred to as a stored version of encoded data, which may include errors present in that stored version of encoded data. For example, the errors may be error bits due to certain bits of the encoded data being flipped when stored in the memory device 316.

In the example, based on the received version of encoded data and weights acquired during a training process of the error reduction NN 312 (e.g., trained as the error reduction NN 56), the error reduction NN 312 estimates an error-reduced version of the encoded data (xr1, xr2, . . . xrN). Thus, the error reduction NN 312 generates an estimate of the N bits of encoded data (b1, b2, . . . bN). For example, the estimate of the error-reduced version of the encoded data (xr1, xr2, . . . xrN) may be equivalent to output from the ECC encoder 310. In this manner, a neural network may be used to implement error reduction NN 312 which has been trained to receive encoded data and output an error-reduced version of the encoded data. Advantageously, the output of the error reduction NN 312—the N bits xr1, xr2, . . . xrN)—may include a reduction of a bit error rate (BER) or an increase of a signal-to-noise ratio (SNR) as compared to a respective BER or SNR of the N bits of encoded data (x1, x2, . . . , xN) retrieved from the memory device 316. Accordingly, the error reduction NN 312 may reduce and/or improve errors which may be introduced by noise present in the encoded data. In various implementations, the error reduction NN 312 may be implemented by multiple processing circuitry 112 (e.g., one or more of any of the processing circuitry 112 depicted in FIGS. 2A-2C).

The memory system 304 may further include the ECC decoder 314, which may be capable of decoding data for any type of encoding technique that is utilized by the ECC encoder 310. The ECC decoder 314 may receive the error-reduced version of encoded data—the N bits (xr1, xr2, . . . xrN)—from the error reduction NN 312. The ECC decoder 314 may decode the error-reduced version of encoded data in accordance with a corresponding decoding process of an ECC encoding technique. Accordingly, based on the error-reduced version of encoded data, the ECC decoder 314 may provide the decoded data in accordance with a decoding technique implemented by the ECC decoder 314. Decoding an error-reduced version of encoded data at the ECC decoder 314 may also include identifying erroneous cells, converting erroneous cells to erasures, and/or correcting the erasures.

In some examples, the ECC decoder 314 may be implemented as an iterative decoder, e.g., including message probability computing (MPC) circuitry. In various implementations, the ECC decoder 314 may implement the error reduction decoding in accordance with any of the capabilities or functionalities described herein.

The neural network 150 of FIG. 1D and/or neural network 170 of FIG. 1E (e.g., as implemented by one or more processing units of FIGS. 2A-2C) may be used to implement the error reduction neural network 312 of FIG. 3. In the example, the memory 145 of FIG. 2A, 2B, or 2C may store pluralities of coefficients specific to various iterative decoding technique associated with one or more types encoded data that may encoded by the ECC encoder 310. Accordingly, a hardware implementation of neural network 150 or recurrent neural network 170 may be used as an error reduction NN to estimate an error-reduced version of encoded data based on input data encoded by the FCC encoder 310, using any of multiple encoding techniques available to the ECC encoder. The error reduction NN 312, which may also be an error reduction RNN, may estimate an error-reduced version of encoded data, to facilitate providing decoded data from the ECC decoder 314.

The ECC encoder 310 and the ECC decoder 314 may each be implemented using discrete components such as an application specific integrated circuit (ASIC) or other circuitry, or the components may reflect functionality provided by circuitry within the controller 308 that does not necessarily have a discrete physical form separate from other portions of the controller 308. Although illustrated as components within the controller 308 in FIG. 3, each of the FCC encoder 310 and ECC decoder 314 may be external to the controller 308 or have a number of components located within the controller 308 and a number of components located external to the controller 308.

The memory device 316 may include a number of arrays of memory cells (e.g., non-volatile memory cells). The arrays can be flash arrays with a NAND architecture, for example. However, embodiments are not limited to a particular type of memory array or array architecture. Floating-gate type flash memory cells in a NAND architecture may be used, but embodiments are not so limited. The cells may be multi-level cells (MLC) such as triple level cells (TLC) which store three data bits per cell. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

According to a number of embodiments, controller 308 may control encoding of a number of received data bits according to the ECC encoder 310 that allows for later identification of erroneous bits and the conversion of those erroneous bits to erasures. The controller 308 may also control programming the encoded number of received data bits to a group of memory cells in memory device 316.

The apparatus shown in FIG. 3 may be implemented in any of a variety of products employing processors and memory including for example cameras, phones, wireless devices, displays, chip sets, set top boxes, gaming systems, vehicles, and appliances. Resulting devices employing the memory system may benefit from examples of neural networks described herein to perform their ultimate user function.

Figure 4:
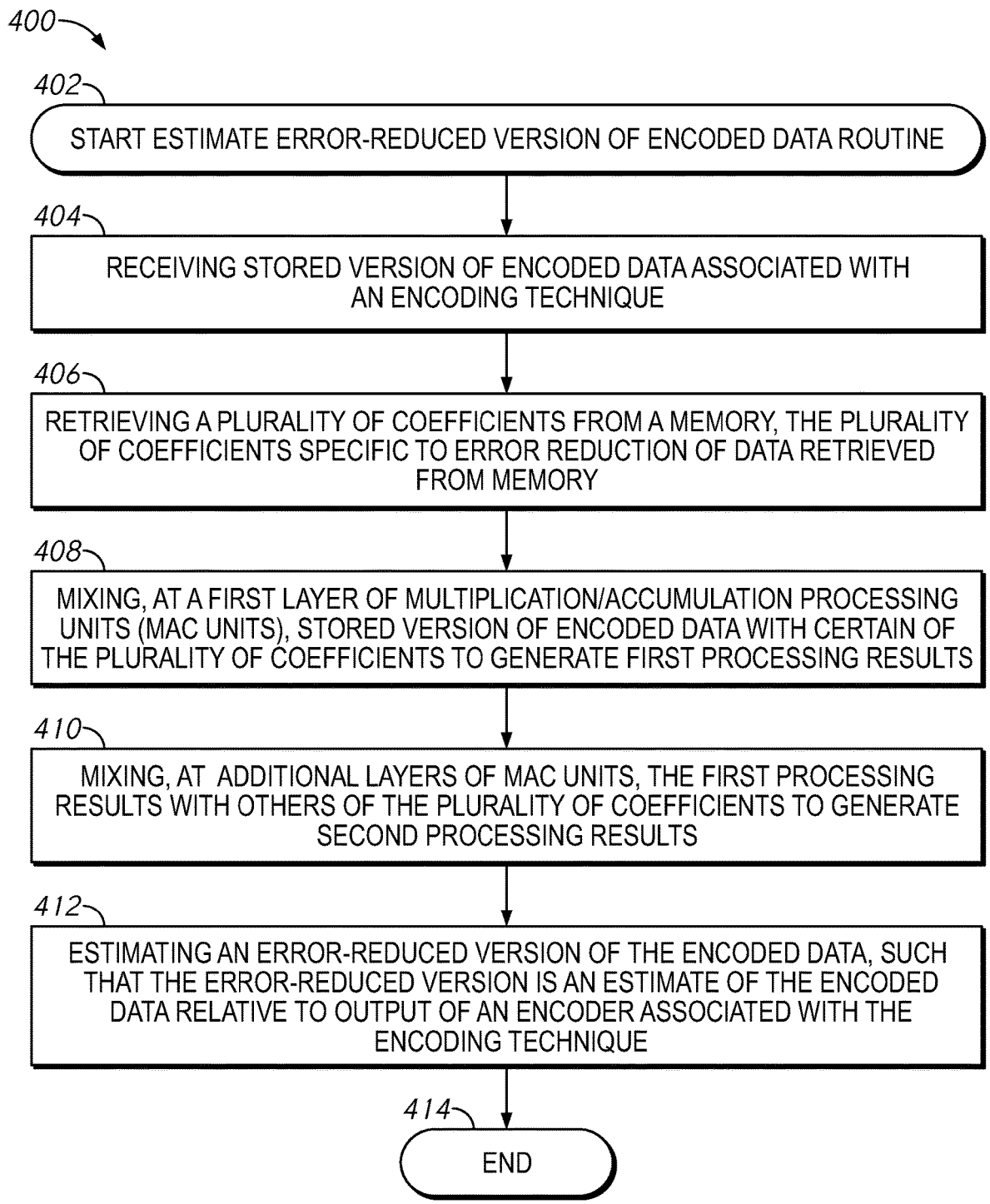
FIGS. 4 and 5 are flowcharts of methods arranged in accordance with examples described herein.

FIG. 4 is a flowchart of a method 400 in accordance with examples described herein. Example method 400 may be implemented using, for example, system 100 in FIG. 1C, the neural network 150 of FIG. 1D, neural network 170 of FIG. 1E (e.g., being implemented by one or more processing units of FIGS. 2A-2C), and/or the error reduction NN 312 of FIG. 3, or any system or combination of the systems depicted in the aforementioned Figures. In some examples, the blocks in example method 400 may be performed by a computing device such as an electronic device 110 of FIG. 1C and/or in conjunction with a processing unit, such as processing circuitry 112 of FIG. 2A, 2B, or 2C. The operations described in blocks 402-412 may also be stored as computer-executable instructions in a computer-readable media 105, storing the executable instructions 115 for a neural network to estimate an error-reduced version of encoded data, e.g., based on a received version of encoded data.

Example method 400 may begin with a block 402 that starts execution of estimate an error-reduced version of encoded data routine. The method may include a block 404 that recites "receiving stored version of encoded data associated with an encoding technique." In the context of apparatus 300, the encoded data may be obtained from the memory device 316, as described with respect to FIG. 3. As described herein, the one or more processing circuitry 112, implementing an error reduction NN, may be configured to obtain a variety of types of input data that may be encoded with various encoding techniques, such as data that has been encoded with a low density parity check coding (LDPC), a Reed-Solomon coding, a Bose-Chaudhuri-Hocquenghem (BCH), and/or Polar coding. In the example, during transmission of the encoded data from a memory (e.g., memory device 316) to the error reduction NN, the encoded data may experience noise, e.g., due to voltage or current disturbances in a computing or electronic device in which the memory device resides. Additionally or alternatively with respect to noise in the encoded data, storing encoded data in a memory may introduce environmental or other noise. For example, noise may be introduced in storing the encoded data in a memory that is degraded (e.g., due to bit flips). Accordingly, encoded data retrieved from a memory may be referred to as a stored version of encoded data, which may include errors present in that stored version of encoded data. For example, the errors may be error bits due to certain bits of the encoded data being flipped when stored in the memory.

Block 404 may be followed by block 406 that recites "retrieving a plurality of coefficients from a memory, the plurality of coefficients specific to error reduction of data retrieved from memory." As described herein, the processing unit may retrieve coefficients for mixing with encoded data; for example, utilizing a memory look-up unit (MLU). For example, the memory may store (e.g., in a database) associations between pluralities of coefficients and certain types of encoded data. In the example, the pluralities of coefficients may be weights for each encoding type; which, when used by an error reduction neural network, allow the error reduction neural network to estimate an error-reduced version of encoded data. The weights may be stored, for example, in the weights memory 118 of FIG. 1C. Accordingly, processing circuitry 112 may retrieve the plurality of coefficients specific to error reduction of data retrieved from memory. For example, the processing circuitry 12 may select the coefficients from a memory part of the implementing computing device, from a memory part of an external computing device, or from a memory implemented in a cloud-computing device. In turn, the plurality of coefficients may be retrieved from the memory as requested by the processing circuitry 112.

Block 406 may be followed by block 408 that recites "mixing, at a first layer of multiplication/accumulation processing units (MAC units), stored version of encoded data with certain of the plurality of coefficients to generate first processing results." As described herein, the processing circuitry 112 utilizes certain of the plurality of coefficients such that mixing such coefficients with data stored version of encoded data generates output data that reflects the processing of the input data with coefficients by the circuitry of FIG. 2A, 2B, or 2C. In some implementations of a recurrent neural network (e.g., recurrent neural network 170), delayed versions of respective outputs of the first layer of MAC units and the stored version of encoded data are mixed to generate the output data, e.g., an estimate of an error-reduced version of encoded data. For example, various ALUs in an integrated circuit may be configured to operate as the circuitry of FIG. 2A, 2B, or 2C, thereby mixing the input data and delayed versions of respective outputs of the first layer of MAC units with the coefficients as described herein. For example, with reference to FIG. 2A, the input data and delayed versions of respective outputs of the first layer of MAC units may be calculated with the plurality of coefficients to generate first processing results, at a first layer of multiplication/accumulation units (MAC units). In some examples, various hardware platforms may implement the circuitry of FIG. 2A, 2B, or 2C, such as an ASIC, a DSP implemented as part of a FPGA, or a system-on-chip.

Block 408 may be followed by block 410 that recites "mixing, at additional layers of MAC units, the first processing results with other of the plurality of coefficients to generate second processing results." As described herein, the processing circuitry 112 utilizes additional plurality of coefficients such that mixing the other coefficients with certain processing results generates output data that reflects the processing of the input data with coefficients by the circuitry of FIG. 2A, 2B, or 2C. In some implementations of a recurrent neural network (e.g., recurrent neural network 170), the first processing results and delayed versions of at least a portion of the first processing results are mixed to generate the output data (e.g., an estimate of decoded data), For example, with reference to FIG. 2A, the processing results of the first layer (e.g., multiplication processing results) and delayed versions of at least a portion of those processing results may be calculated with the additional plurality of coefficients to generate second processing results, at a second layer of multiplication/accumulation units (MAC units). The processing results of the second layer may be calculated with an additional plurality of coefficients to generate the output data B(1) 230.

Block 410 may be followed by block 412 that recites "estimating an error-reduced version of encoded data, such that the error-reduced version of encoded data is an estimate of the encoded data relative to output of an encoder associated with the encoding technique." As described herein, the neural network 150 or recurrent neural network 170 provides output data as output bits which represent the processed data, corresponding to the encoded data (e.g., N encoded input bits) output by an encoder (e.g., the encoded data output by encoder 14) (b1, b2, . . . bN). Accordingly, the error-reduced version of encoded data a (xr1, xr2, . . . xrN) is an estimate of the encoded data relative to output of an encoder associated with the encoding technique. For example, the error-reduced version of the encoded data may include a reduction of a bit error rate (BER) or an increase of a signal-to-noise ratio (SNR) as compared to a respective BER or SNR of encoded data retrieved from memory. Advantageously, an error-reduced version of the encoded data may be decoded by a decoder with reduced errors present in the decoded data. For example, an error reduction NN or RNN may reduce and/or improve errors which may be introduced by noise present in the encoded data. In the example, such noise may be introduced in storing the encoded data in memory that is degraded (e.g., due to bit flips). Accordingly, neural networks described herein transform encoded data to an estimate of an error-reduced version of encoded data. Block 412 may be followed by block 414 that ends the example method 400. In some examples, block 410 may be an optional block.

Figure 5:
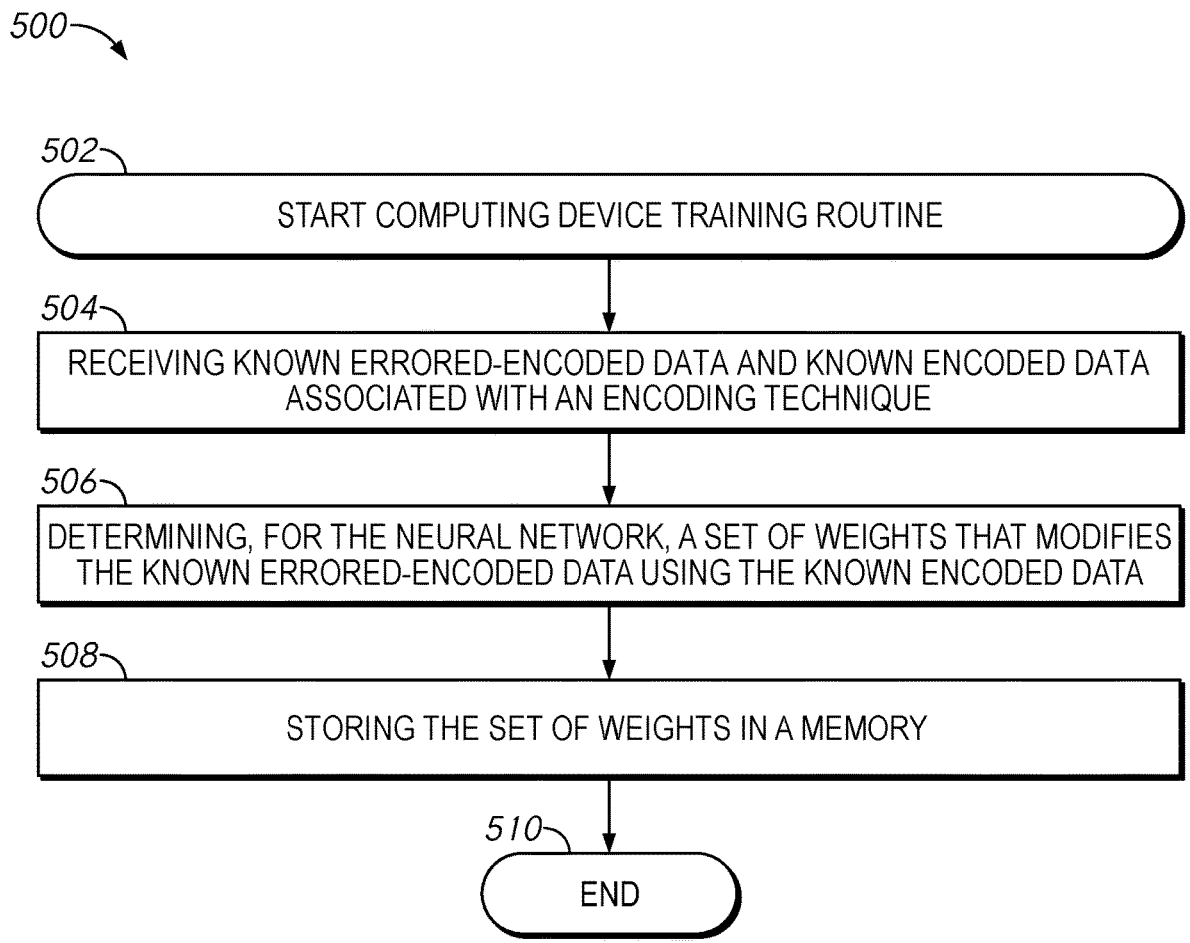

FIG. 5 is a flowchart of a method 500 arranged in accordance with examples described herein. Example method 500 may be implemented using, for example, system 100 in FIG. 1C, the neural network 150 of FIG. 1D, neural network 170 of FIG. 1E (e.g., being implemented by one or more processing circuitry 112s of FIGS. 2A-2C), and/or the error reduction NN 312 of FIG. 3, or any system or combination of the systems depicted in the aforementioned Figures. For example, an error reduction NN 56 or an error reduction NN 312 may be trained using the method 500. In some examples, the blocks in example method 500 may be performed by a computing device such as an electronic device 110 of FIG. 1C and/or in conjunction with a processing circuitry 112, such as processing circuitry 112 of FIG. 2A, 2B, or 2C. The operations described in blocks 502-512 may also be stored as computer-executable instructions in a computer-readable media 105, storing executable instructions to train a neural network to estimate an error-reduced version of encoded data based on encoded data (e.g., a received version of encoded data). Additional, fewer, and/or different blocks may be used in other examples, and the order of the blocks may be different in other examples.

Example method 500 may begin with a block 502 that starts execution of the computing device training routine. The method may include a block 504 recites "receiving known errored-encoded data and known encoded data associated with an encoding technique." Known errored-encoded data and known encoded data may be received by a computing device (e.g., electronic device 110) that includes a neural network, such as the neural network 150 of FIG. 1D, neural network 170 of FIG. 1E (e.g., as implemented by one or more processing circuitry 112s of FIGS. 2A-2C), and/or the ECC decoder 314 of FIG. 3. In the example, errored-encoded data may correspond to known encoded data but with at least one error bit introduced into the encoded data in at least one known portion of the encoded data. Accordingly, errored-encoded data may be representative of a received version of encoded data (x1, x2, . . . xN) that is retrieved from a memory, e.g., a stored version of encoded data. Signaling indicative of the known data (e.g., a set of data pairs) may be provided to the computing device. In the example, the known encoded data may be encoded in accordance with an encoding technique, e.g., by ECC encoder 310. Continuing in the example, data (e.g., signaling indicative of data) known-errored encoded data may be retrieved from a memory (e.g., memory device 316) of a computing device 300. Any of a variety of encoding techniques may have been used to encode the data. For example, the known-errored encoded data may include header information indicative of locations) of one or more error bits due to known memory defects (e.g., known defective memory cells in the memory device 316), The known-errored encoded data may be data that was retrieved in a similar manner as to how data may be provided to an error reduction NN (e.g., error reduction NN 56). For example, the known errored encoded data may be data that was retrieved from a memory having known memory defects. Using the known-errored encoded data, an error reduction NN may be trained on data, such that the error reduction NN may also use the same memory having memory defects, but with reduced error, once trained.

Block 506 may follow block 504. Block 506 recites "determining, for the neural network, a set of weights that modifies the known errored-encoded data using the known encoded data." For example, a neural network, such as error reduction NN 56 or error reduction NN 312, may be trained using the known encoded and known errored-encoded data received in block 504. The known encoded data may be compared with the known errored-encoded data received in block 504. Based on the comparison, the weights used to estimate an error-reduced version of encoded data by using the neural network may be evaluated as the set of weights.

The weights may be numerical values, which, when used by the neural network, allow the neural network to estimate an error-reduced version of encoded data based on the encoded data encoded with an encoding technique. The weights may be stored, for example, in the weights memory 118 of FIG. 1C or memory 145 of FIG. 2A, 2B, or 2C. In some examples, training may not be performed, and an initial set of weights may simply be provided to a neural network, e.g., based on training of another neural network.

In some examples, multiple sets of data pairs may be received (e.g., in block 504), with each set corresponding to data encoded with a different encoding technique. Accordingly, multiple sets of weights may be determined (e.g., in block 506), each set corresponding to a different encoding technique. For example, one set of weights may be determined which may be used to decode data encoded in accordance with LDPC coding while another set of weights may be determined which may be used to decode data encoded with BCH coding.

Block 508 may follow block 506. Block 508 recites "storing the set of weights in a memory." In some examples, a set of weights may be selected that is associated with the particular encoding technique used to encode the data received in block 504. The set of weights may be stored in a memory (e.g., memory 118 of FIG. 1C) for selection from among multiple available sets of weights, each for use in estimating an error-reduced version of encoded data, e.g., based on a received version of encoded data and in accordance with its respective encoding technique.

In some examples, blocks 504-508 may be repeated for data encoded with different encoding techniques. For example, known data may be received in block 504, encoded with one particular encoding technique (e.g., LDPC coding) and a known errored-encoded data pair associated with that known encoded data. A set of weights may be selected that is for use with LDPC coding and provided to a neural network for determining weights in block 506. Additional known data may then be received in block 504, encoded with a different encoding technique (e.g., BCH coding) and additional known errored-encoded data pair associated with that known encoded data. Another set of weights may be selected that is for use with BCH coding and provided to a neural network for determining weights in block 506. In this manner, one neural network may be trained to estimate an error-reduced version of encoded data based on data encoded with multiple encoding techniques.

The blocks included in the described example methods 400 and 500 are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 6:
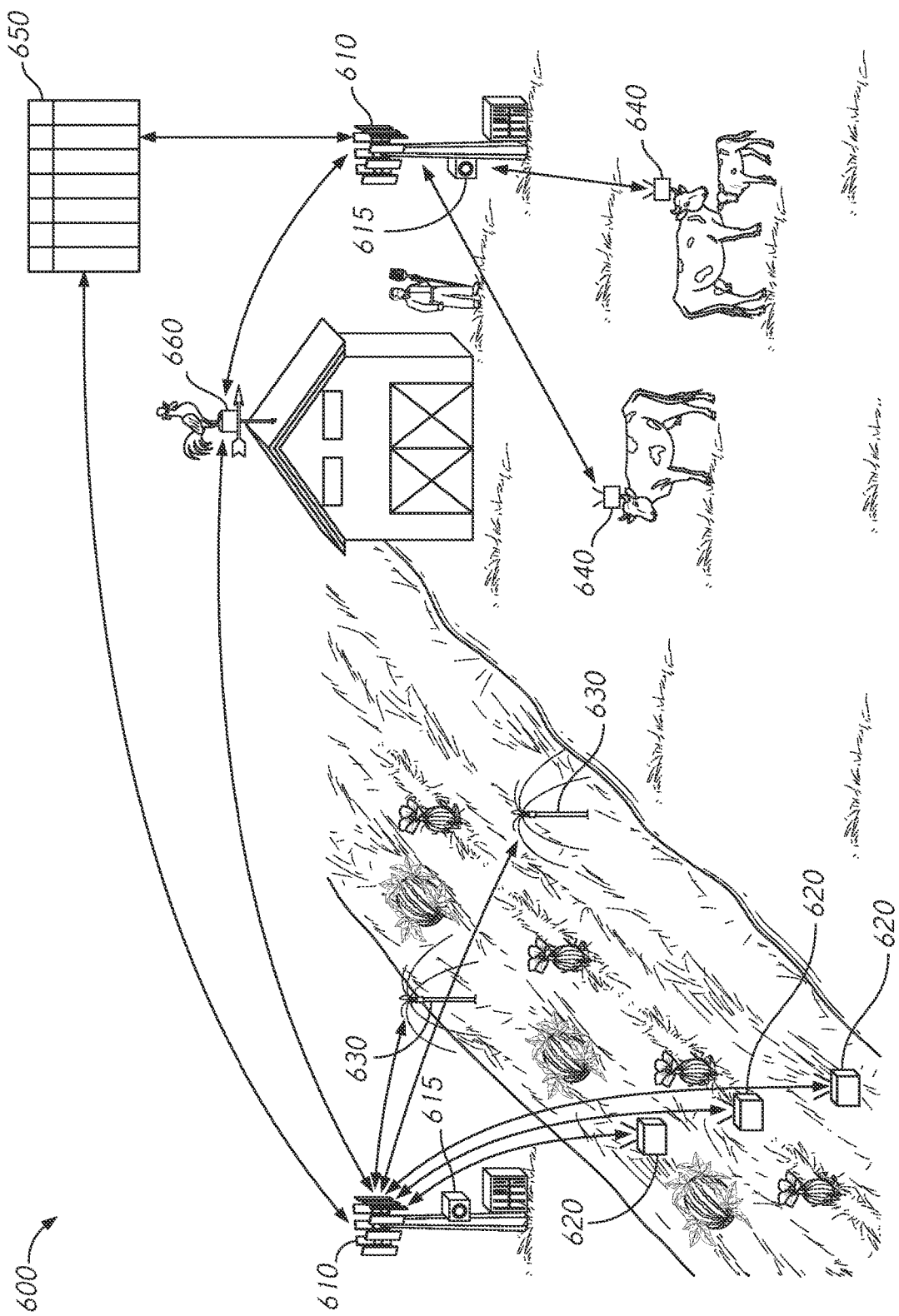
FIG. 6 is a schematic illustration of a wireless communications system arranged in accordance with aspects of the present disclosure.

FIG. 6 illustrates an example of a wireless communication system 600 in accordance with aspects of the present disclosure. The wireless communication system 600 includes small cells 610, camera devices 615, communication devices 620, sensor devices 630, communication devices 640, data center 650, and sensor device 660. In the depicted system 600, a small cell 610 may form a hierarchal network, for an agricultural use, with a camera device 615, communication devices 620, sensor devices 630, and sensor device 660, Such a network formed by small cell 610 may communicate data sets and inference results among the networked devices and the data center 650. Continuing in the depicted system 600, another small cell 610 may form another hierarchal network, for another agricultural use, with communication devices 640, data center 650, and sensor device 660. Similarly, such a network formed by the additional small cell 610 may communicate data sets and inference results among the networked devices and the data center 650. While depicted in certain agricultural networks with particular small cells 610, it can be appreciated that various networks, whether hierarchal or ad-hoc, may be formed among the devices, cells, or data center of wireless communication system 600.

The system 600 may facilitate a wide range of wireless communications connections in a 5G system that may include various frequency bands, including but not limited to: a sub 6 GHz band (e.g., 700 MHz communication frequency), mid range communication bands (e.g., 2.4 GHz), mmWave bands (e.g., 24 GHz), and a NR band (e.g., 3.5 GHz).

Additionally or alternatively, the wireless communications connections may support various modulation schemes, including but not limited to: filter bank multi-carrier (FBMC), the generalized frequency division multiplexing (GFDM), universal filtered multi-carrier (UFMC) transmission, bi orthogonal frequency division multiplexing (BFDM), sparse code multiple access (SCMA), non-orthogonal multiple access (NOMA), multi-user shared access (MUSA), and faster-than-Nyquist (FTN) signaling with time-frequency packing. Such frequency bands and modulation techniques may be a part of a standards framework, such as Long Term Evolution (LTE) (e.g., 1.8 GHz band) or other technical specification published by an organization like 3GPP or IEEE, which may include various specifications for subcarrier frequency ranges, a number of subcarriers, uplink/downlink transmission speeds, TDD/FDD, and/or other aspects of wireless communication protocols.

The system 600 may depict aspects of a radio access network (RAN), and system 600 may be in communication with or include a core network (not shown). The core network may include one or more serving gateways, mobility management entities, home subscriber servers, and packet data gateways. The core network may facilitate user and control plane links to mobile devices via the RAN, and it may be an interface to an external network (e.g., the Internet). Small cells 610 and data center 650 may be coupled with the core network or with one another, or both, via wired or wireless backhaul links (e.g., S1 interface, X2 interface, etc.).

The system 600 may provide communication links connected to devices or "things," such as communication devices 620, communication devices 640, and sensor devices 630 and 660, to provide an Internet of Things ("IoT") framework. Connected things within the IoT may operate within frequency bands licensed to and controlled by cellular network service providers, or such devices or things may. Such frequency bands and operation may be referred to as narrowband IoT (NB-IoT) because the frequency bands allocated for IoT operation may be small or narrow relative to the overall system bandwidth. Frequency bands allocated for NB-IoT may have bandwidths of, 50, 100, 150, or 200 kHz, for example.

Additionally or alternatively, the IoT may include devices or things operating at different frequencies than traditional cellular technology to facilitate use of the wireless spectrum. For example, an IoT framework may allow multiple devices in system 600 to operate at a sub 6 GHz band or other industrial, scientific, and medical (ISM) radio bands where devices may operate on a shared spectrum for unlicensed uses. The sub-6 GHz band may also be characterized as and may also be characterized as an NB-IoT band. For example, in operating at low frequency ranges, devices providing sensor data for "things," such as sensor devices 630, may utilize less energy, resulting in power efficiency and may utilize less complex signaling frameworks, such that devices may transmit asynchronously on that sub 6 GHz band. The sub 6 GHz band may support a wide variety of uses case, including the communication of sensor data from various sensors devices. Examples of sensor devices include sensors for detecting energy, heat, light, vibration, biological signals (e.g., pulse, EEG, EKG, heart rate, respiratory rate, blood pressure), distance, speed, acceleration, or combinations thereof. Sensor devices may be deployed on buildings, agricultural fields, individuals, and/or in other locations in the environment. The sensor devices may communicate with one another and with computing systems which may aggregate and/or analyze the data provided from one or multiple sensor devices in the environment.

Additionally or alternatively, communication devices 620 and 640 may form device to device (D2D) connections with other communication devices or other elements of the system 600. For example, the communication devices 620 may form RFID, WiFi, MultiFire, Bluetooth, or Zigbee connections with other devices, including a communication device 640 or a sensor device 630. In some examples, D2D connections may be made using licensed spectrum bands, and such connections may be managed by a cellular network or service provider. Accordingly, while the above example was described in the context of narrowband it can be appreciated that other device to device connections may be utilized by communication devices 620 or 640 to provide information (e.g., sensor data) collected on different frequency bands than a frequency band used by communication devices 620 or 640 for transmission of that information. For example, the communication devices 620 or 640 and sensor devices 630 and 660 may form wireless networks, operating in either a hierarchal or ad hoc network fashion, depending, in part, on the connection to another element of the system 600.

Devices in system 600 may also D2D connections with other mobile devices or other elements of the system 1000. For example, the communication device 640 may form a narrowband IoT connections with other devices, including sensor device 660 or communication device 620. In some examples, D2D connections may be made using licensed spectrum bands, and such connections may be managed by a cellular network or service provider, e.g., a cellular network or service provider of small cell 610. Accordingly, while the above example was described in the context of a narrowband IoT, it can be appreciated that other device-to-device connections may be utilized by the devices of system 600.

The wireless communication system 600 may also be implemented as a 5G wireless communication system, having various mobile or other electronic device endpoints. As an example, the camera device 615 may be a mobile endpoint; and communication devices 620 and sensor devices 630 may be sensor endpoints in a 5G wireless communication system. Continuing in the example, the camera device 615 may collect data sets used for training and inference of machine learning or AI techniques at that respective device, e.g., images of watermelons in an agricultural field. Such image data sets may be acquired by the camera device and may be provided to the data center 650 for training or processing inference results based on the image data sets acquired. As another example, the communication devices 620 or 640 and/or sensor devices 630 or 660 may communicate acquired information via the small cells 610. For example, when any such devices are implemented as electronic device 110, the devices may be programmed with an application (e.g., may include processing circuitry 112 and computer readable media 105 encoded with instructions 115 which, when executed, cause the electronic device 110 to perform described functions) for a neural network to estimate an error-reduced version of encoded data. For example, the communication devices 620 or 640 and/or sensor devices 630 or 600 may be programmed to receive an indication from a touchscreen of a mobile communication device that certain encoded data received in a 5G wireless transmission is to be decoded by first passing the received version of encoded data through an error reduction NN (e.g., error reduction NN 56) implemented at processing circuitry 112. In the example, a 5G wireless transmission may introduce errors to transmitted encoded data due to noise or environmental disturbances to the 5G wireless transmission. Advantageously, an error reduction NN may facilitate decoding of encoded data received via a 5G wireless transmission, e.g., by reducing noise present in the encoded data, thereby reducing errors in the decoded data after decoding of an error-reduced version of the encoded data. Using such error reduction NNs, the wireless communication system 600 may facilitate the communication of inference results, such as a prediction of a growth rate of the watermelons based on various stages of growth for different watermelons in the agricultural field, e.g., a full-grown watermelon or an intermediate growth of a watermelon as indicated by a watermelon flower on the watermelon. For example, once communicated with reduced error to the data center 650, the data center 650 may make inference results, to provide such inference results for use in the wireless communication system 600.

In various examples, the elements of wireless communication system 600, such as the camera device 615, communication devices 620, sensor devices 630, communication devices 640, sensor device 660, may be implemented as electronic devices described herein that reduce noise present in encoded data transmitted in wireless communications. For example, the sensor device 660 may be implemented as electronic devices described herein, such as electronic device 110 of FIG. 1C, processing circuitry 112 of FIGS. 2A-2C, apparatus 300 of FIG. 3, or any system or combination of the systems depicted in the Figures described herein.

Therefore, the system 600 may facilitate the communication of 5G wireless transmissions for various devices in the system 600 when implementing such error reduction NNs while also increasing the accuracy of 5G wireless transmissions, e.g., including higher-order memory effects in a processing circuitry 112 of FIGS. 2A-2C, Accordingly, the system 600 may include devices that facilitate decoding of encoded data received via a 5G wireless transmission, e.g., by reducing noise present in the encoded data, thereby reducing errors in the decoded data after decoding of an error-reduced version of the encoded data.

Figure 7:
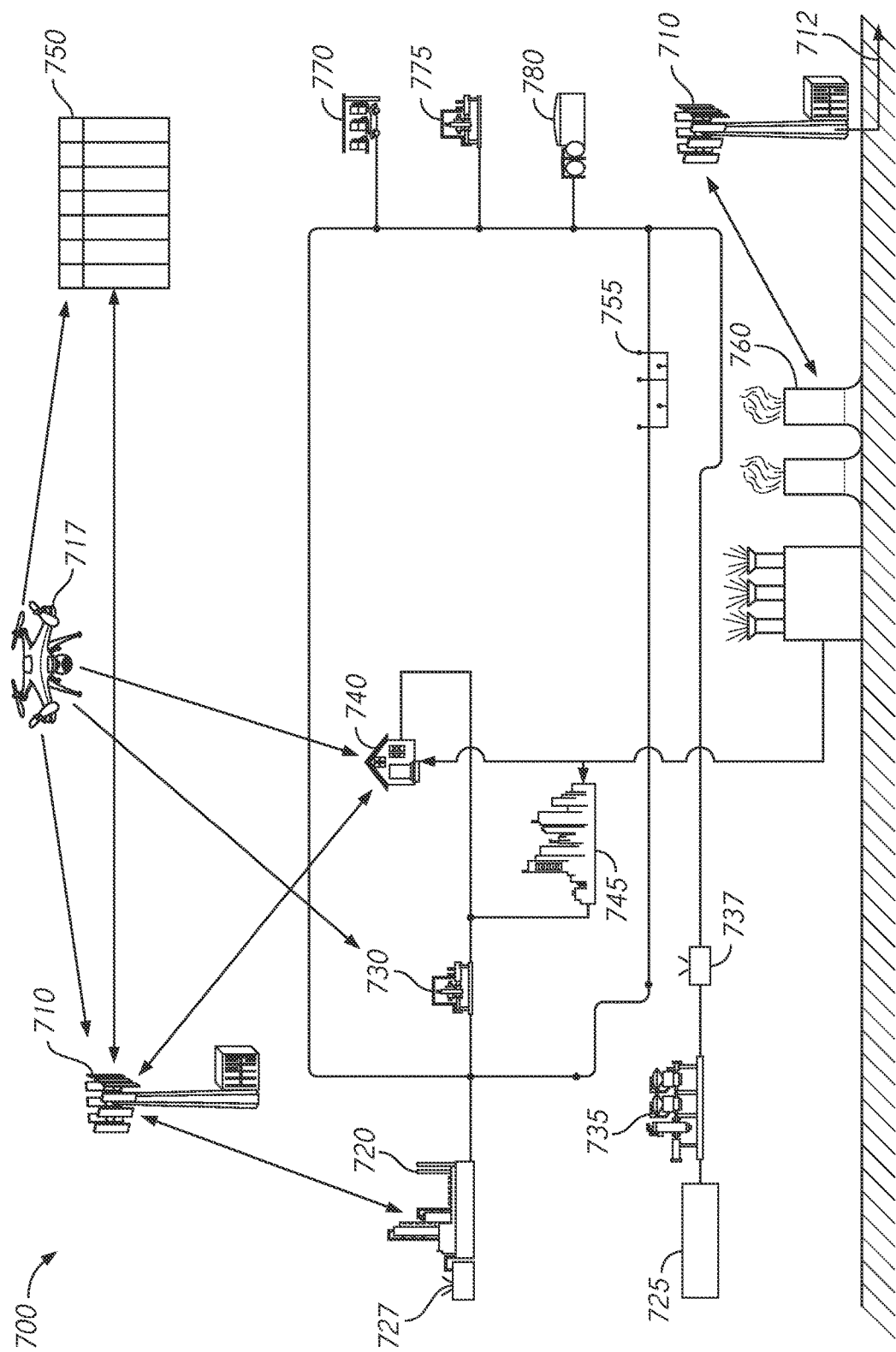
FIG. 7 is a schematic illustration of a communications system arranged in accordance with aspects of the present disclosure.

FIG. 7 illustrates an example of a communication system 700 in accordance with aspects of the present disclosure. The communication system 700 includes small cells 710, wired communication link 712, drone 717, industrial user 720, industrial communication device 727, substation 730, industrial pipeline 725, pipeline receiving station 735, pipeline communication device 737, residential user 740, commercial user 745, data center 750, sensor device 755, power generation user 760, fuel station 770, substation 775, and fuel storage 780.

In the depicted communication system 700, small cells 710 may form a hierarchal network to provide a status of the fuel for various users of the industrial pipeline system, thereby facilitating fuel transmission, distribution, storage, or power generation based on distributed fuel. The fuel may be various types of gas or oil, for example, crude oil, diesel gas, hydrogen gas, or natural gas. The fuel may be provided and utilized by an industrial user 720, substation 730 or substation 775, residential user 740, commercial user 745, or fuel station 770. Various statuses regarding the fuel may be provided to small cells 710, drone 717, data center 750, or wired communication link 712 by the various communication devices in such an industrial communication system 700. For example, industrial communication device 727, pipeline communication device 737, or sensor device 755 may provide a status as to a flow of the fuel through the pipeline network depicted in FIG. 12. Additionally or alternatively, the fuel may be provided through the pipeline network for use in power generation at power generation user 760 or for storage at fuel storage 780. The fuel is provided to the pipeline network by industrial pipeline 725 at pipeline receiving station 735.

As fuel flows through the pipeline network, industrial communication device 727, pipeline communication device 737, or sensor device 755 may be implemented as electronic device 100 coupled to various I/O devices to receive data input as to a status of the fuel. Accordingly, encoded data sets regarding the fuel may be acquired by the industrial communication device 727, pipeline communication device 737, or sensor device 755 for further processing of inference results regarding a status of the fuel. For example, the pipeline communication device 737 may communicate via a 5G communications signal a status indicative of power consumption at various users of the pipeline network, such as industrial user 720, residential user 740, or commercial user 745. As another example, substation 730 or substation 775 may provide a power generation status as to power generated by elements of pipeline network coupled to the substations 730 or substation 775. Accordingly, substation 730 may provide, as encoded data, a power generation status of industrial user 720; and substation 775 may provide, as encoded data, a power generation status as power generation user 760. Such various statuses may be provided to the data center 750 via drone 717 or small cells 710 communicating with devices located at the respective users of the pipeline network or devices located at the substations 730 or 775, In the implementation of system 700, a fuel storage status may also be provided, as encoded data, to the data center 750 by the fuel storage 780.

In various examples, the elements of wireless communication system 700, such as the industrial communication device 727, pipeline communication device 737, or sensor device 755, may be implemented as electronic devices described herein that reduce noise present in encoded data using an error reduction NN (e.g., error reduction NN 56). For example, the sensor device 755 may be implemented as electronic devices described herein, such as electronic device 100 of FIG. 1C, processing circuitry 112 of FIGS. 2A-2C, apparatus 300 of FIG. 3 or any system or combination of the systems depicted in the Figures described herein.

In an example of processing industrially-acquired data sets of the system 700, the devices of system 700, such as industrial communication device 727, pipeline communication device 737, or sensor device 755, and users of system 700 may communicate, via communicated 5G signals, encoded data sets regarding a status of the fuel, power consumption, or power generation, to the data center 750 for further processing of inference results. In an example, a fuel flow status at sensor device 755 may be communicated to the data center 750 via the small cell 710. The small cell 710 may be programmed with an application (e.g., may include processing circuitry 112 and computer readable media 105 encoded with instructions 115 which, when executed, cause the electronic device 110 to perform described functions) for a neural network to estimate an error-reduced version of encoded data. For example, the small cell 710 may be programmed to receive an indication from a touchscreen of a mobile communication device that certain encoded data received in a 5G wireless transmission is to be decoded by first passing the received version of encoded data through an error reduction NN (e.g., error reduction NN 56) implemented at processing circuitry 112. In the example, a 5G wireless transmission may introduce errors to transmitted encoded data due to noise or environmental disturbances to the 5G wireless transmission. Advantageously, an error reduction NN may facilitate decoding of encoded data received via a 5G wireless transmission, e.g., by reducing noise present in the encoded data, thereby reducing errors in the decoded data after decoding of an error-reduced version of the encoded data.

Accordingly, the system 700 may facilitate the acquisition and communication of encoded data sets for various devices in the system 700 when implementing such neural networks as described herein, e.g., including higher-order memory effects in a processing circuitry 112 of FIGS. 2A-2C.

Certain details are set forth above to provide a sufficient understanding of described examples. However, it will be clear to one skilled in the art that examples may be practiced without various of these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signal may be provided directly to and/or received directly from the recited components without intervening components, but also may be provided to and/or received from the certain components through intervening components.

Techniques described herein may be used for various wireless communications systems, which may include multiple access cellular communication systems, and which may employ code division multiple access (CDMA), time division multiple access (TDMA), frequency division multiple access (FDMA), orthogonal frequency division multiple access (OFDMA), or single carrier frequency division multiple access (SC-FDMA), or any a combination of such techniques. Some of these techniques have been adopted in or relate to standardized wireless communication protocols by organizations such as Third Generation Partnership Project (3GPP), Third Generation Partnership Project 2 (3GPP2) and IEEE. These wireless standards include Ultra Mobile Broadband (UMB), Universal Mobile Telecommunications System (UMTS), Long Term Evolution (LTE), LTE-Advanced (LTE-A), LTE-A Pro, New Radio (NR), IEEE 802.11 (WiFi), and IEEE 802.16 (WiMAX), among others.

The terms "5G" or "5G communications system" may refer to systems that operate according to standardized protocols developed or discussed after, for example, LTE Releases 13 or 14 or WiMAX 802.16e-2005 by their respective sponsoring organizations. The features described herein may be employed in systems configured according to other generations of wireless communication systems, including those configured according to the standards described above.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein.

A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure, in other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus comprising:
a memory configured to store encoded data; and
a neural network configured to receive, from the memory, the encoded data including at least one error bit and further configured to mix the encoded data received from the memory with at least a portion of a plurality of coefficients selected for error reduction of data retrieved from the memory to generate an estimate of an error-reduced version of the encoded data, wherein the neural network comprises at least one stage configured to provide delayed versions of respective outputs and mix the delayed versions of the respective outputs with at least a portion of the encoded data.

2. The apparatus of claim 1, further comprising an encoder configured to provide the encoded data to the memory in accordance with an encoding technique.

3. The apparatus of claim 1, wherein the error-reduced version of the encoded data corresponds to the encoded data received from the memory without the at least one error bit.

4. The apparatus of claim 1, wherein the neural network comprises at least two stages to generate the error-reduced version of the encoded data.

5. The apparatus of claim 1, wherein the error-reduced version of the encoded data includes a reduction of a bit error rate (BER) or an increase of a signal-to-noise ratio (SNR) as compared to a respective BER or SNR of the stored version of the encoded data.

6. The apparatus of claim 1, further comprising a decoder configured to receive the error-reduced version of the encoded data and to provide decode data based on the error-reduced version of the encoded data.

7. An apparatus comprising:
a memory configured to store encoded data; and
a neural network configured to receive, from the memory, the encoded data including at least one error bit, and further configured to mix the encoded data received from the memory with at least a portion of a plurality of coefficients selected for error reduction of data retrieved from the memory to generate an estimate of an error-reduced version of the encoded data, wherein the neural network comprises at least two stages to generate the error-reduced version of the encoded data, the at least two stages comprising:
a first stage of circuitry configured to receive the encoded data from the memory, to combine the received encoded data with a first set of predetermined weights, and to evaluate at least one non-linear function using combinations of the received encoded data and delayed versions of the combinations of the received encoded data to provide intermediate data; and
a second stage of circuitry configured to receive the intermediate data and combine the intermediate data using a second set of predetermined weights to generate the error-reduced version of the encoded data.

8. The apparatus of claim 7, wherein the first and second sets of predetermined weights were trained for error reduction of data retrieved from the memory.

9. The apparatus of claim 7, wherein the first and second sets of predetermined weights are based on training of a neural network using known errored-encoded data and encoded data pairs, the known errored-encoded data including at least one error bit.

10. The apparatus of claim 8, wherein the first stage of circuitry further comprises a first plurality of memory look-up units (MLUs), the first plurality of MLUs each configured to retrieve at least one intermediate data value corresponding to an output of a respective one of the first plurality of multiplication/accumulation units based on the at least one non-linear function.

11. The apparatus of claim 10, wherein the decoder is configured to decode encoded data in accordance with an error-correction code decoding technique.

12. The apparatus of claim 10, wherein the decoder comprises an iterative decoder configured to decode encoded data in accordance with an error-correction code iterative decoding technique.

13. An apparatus comprising:
a memory configured to store encoded data; and
a neural network configured to receive, from the memory, the encoded data including at least one error bit, and further configured to mix the encoded data received from the memory with at least a portion of a plurality of coefficients selected for error reduction of data retrieved from the memory to generate an estimate of an error-reduced version of the encoded data, wherein the neural network comprises at least two stages to generate the error-reduced version of the encoded data, wherein the at least two stages include a first stage of circuitry comprising a first plurality of multiplication/accumulation units, the first plurality of multiplication/accumulation units each configured to multiply at least one bit of the received encoded data with at least one of the first set of predetermined weights and sum multiple weighted bits of the encoded data.

14. A method comprising:
mixing, at a first stage of a neural network, a first version of encoded data retrieved from a memory and delayed versions of respective outputs of the first stage of the neural network with a first subset of a plurality of coefficients selected for error reduction of data retrieved from the memory to generate first processing results;
mixing, at second stage of the neural network, the first processing results and delayed versions of at least a portion of the first processing results with a second subset of the plurality of coefficients to generate second processing results; and
generating, by the neural network, an estimate of an error-reduced version of the encoded data based on the second processing results.

15. The method of claim 14, further comprising delaying, at respective delay units associated with the first stage of the neural network, the outputs of the first stage of the neural network to generate the delayed versions of the respective outputs of the first stage of the neural network.

16. The method of claim 14, further comprising multiplying the first version of the encoded data and the delayed versions of the respective outputs of the first stage of the neural network with the first subset of the plurality of coefficients to generate the first processing results.

17. The method of claim 14, further comprising obtaining the first version of the encoded data from the memory.

18. The method of claim 17, wherein the stored version of the encoded data includes at least one error bit.

19. The method of claim 14, further comprising:
decoding the error-reduced version of the encoded data to provide decoded data; and
writing the decoded data to or reading the decoded data from the memory.

20. The method of claim 14, wherein the error-reduced version of the encoded data is an estimate of the encoded data relative to output of an encoder associated with an encoding technique.

* * * * *